United States Patent
Nishida et al.

(10) Patent No.: US 10,835,932 B2
(45) Date of Patent: Nov. 17, 2020

(54) SUBSTRATE PROCESSING APPARATUS AND SUBSTRATE PROCESSING METHOD

(71) Applicant: SCREEN Holdings Co., Ltd., Kyoto (JP)

(72) Inventors: Takayuki Nishida, Kyoto (JP); Akio Hashizume, Kyoto (JP); Junichi Ishii, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 257 days.

(21) Appl. No.: 15/905,067

(22) Filed: Feb. 26, 2018

(65) Prior Publication Data
US 2018/0185885 A1    Jul. 5, 2018

Related U.S. Application Data

(62) Division of application No. 14/557,773, filed on Dec. 2, 2014, now abandoned.

(30) Foreign Application Priority Data

Dec. 3, 2013   (JP) .................................. 2013-249734
Dec. 3, 2013   (JP) .................................. 2013-249735

(51) Int. Cl.
*B08B 1/04*       (2006.01)
*H01L 21/67*      (2006.01)

(52) U.S. Cl.
CPC .......... *B08B 1/04* (2013.01); *H01L 21/67046* (2013.01); *H01L 21/67051* (2013.01)

(58) Field of Classification Search
CPC .................. H01L 21/67046; H01L 21/67051; B08B 1/04
See application file for complete search history.

(56) References Cited

U.S. PATENT DOCUMENTS

| 6,932,884 B2 | 8/2005 | Saito |
| 7,332,055 B2 | 2/2008 | Orii et al. ................ 156/345.17 |

(Continued)

FOREIGN PATENT DOCUMENTS

| JP | 2002-43265 | 2/2002 |
| JP | 2005-93694 | 3/2005 |

(Continued)

OTHER PUBLICATIONS

Japanese Office Action (Application No. 2013-249734) dated Dec. 5, 2017 and partial English translation thereof.

(Continued)

*Primary Examiner* — Alexander Markoff
(74) *Attorney, Agent, or Firm* — Ostrolenk Faber LLP

(57) ABSTRACT

It is an object to prevent adhesion of a processing liquid to a non-processing region of a substrate. In order to achieve the object, a substrate processing apparatus includes a substrate rotating mechanism, a discharging portion for discharging a processing liquid to a substrate, a moving portion for moving a discharging portion, and a controller. The discharging portion starts to discharge the processing liquid at a first position and is moved to a second position. The first position is a position of the discharging portion where a section of a passage of the discharging portion is projected onto a first region, and the second position is a position of the discharging portion where the section of the passage is projected onto a second region. The first region is a region on the peripheral edge side of the substrate from the second region.

6 Claims, 15 Drawing Sheets

(56) References Cited

U.S. PATENT DOCUMENTS

| | | | |
|---|---|---|---|
| 7,543,593 B2 | 6/2009 | Orii et al. | 134/1.3 |
| 7,862,680 B2 | 1/2011 | Orii et al. | 156/345.21 |
| 8,127,391 B2 | 3/2012 | Nonomura et al. | 15/77 |
| 8,617,318 B2 | 12/2013 | Amano et al. | 134/32 |
| 8,828,183 B2 | 9/2014 | Namba et al. | 156/345.21 |
| 2006/0234503 A1 | 10/2006 | Yamada | |
| 2007/0044823 A1 | 3/2007 | Yamamoto | |
| 2007/0137677 A1 | 6/2007 | Nanba | |
| 2009/0025763 A1* | 1/2009 | Nonomura | H01L 21/67046 134/198 |
| 2009/0038641 A1 | 2/2009 | Matsumoto | 134/6 |
| 2009/0050177 A1* | 2/2009 | Nagayasu | B08B 1/04 134/6 |
| 2009/0186488 A1 | 7/2009 | Takeo et al. | 438/748 |
| 2010/0108095 A1* | 5/2010 | Mouri | H01L 21/67051 134/6 |
| 2013/0152976 A1* | 6/2013 | Amano | H01L 21/67051 134/26 |
| 2013/0156948 A1* | 6/2013 | Amano | H01L 21/67051 427/240 |

FOREIGN PATENT DOCUMENTS

| | | |
|---|---|---|
| JP | 2006-278592 | 10/2006 |
| JP | 2007-165488 | 6/2007 |
| JP | 2009-32846 | 2/2009 |
| JP | 2009-164405 | 7/2009 |
| JP | 2010-205876 | 9/2010 |
| JP | 2012-164858 | 8/2012 |
| JP | 2013-128015 | 6/2013 |

OTHER PUBLICATIONS

Korean Decision of Grant dated Sep. 29, 2016 for Korean Application No. 10-2014-0169609.

Japanese Office Action (JP Application No. 2013-249734) dated Mar. 14, 2017 and its English translation.

Japanese Office Action (JP Application No. 2013-249735) dated Mar. 21, 2017.

* cited by examiner

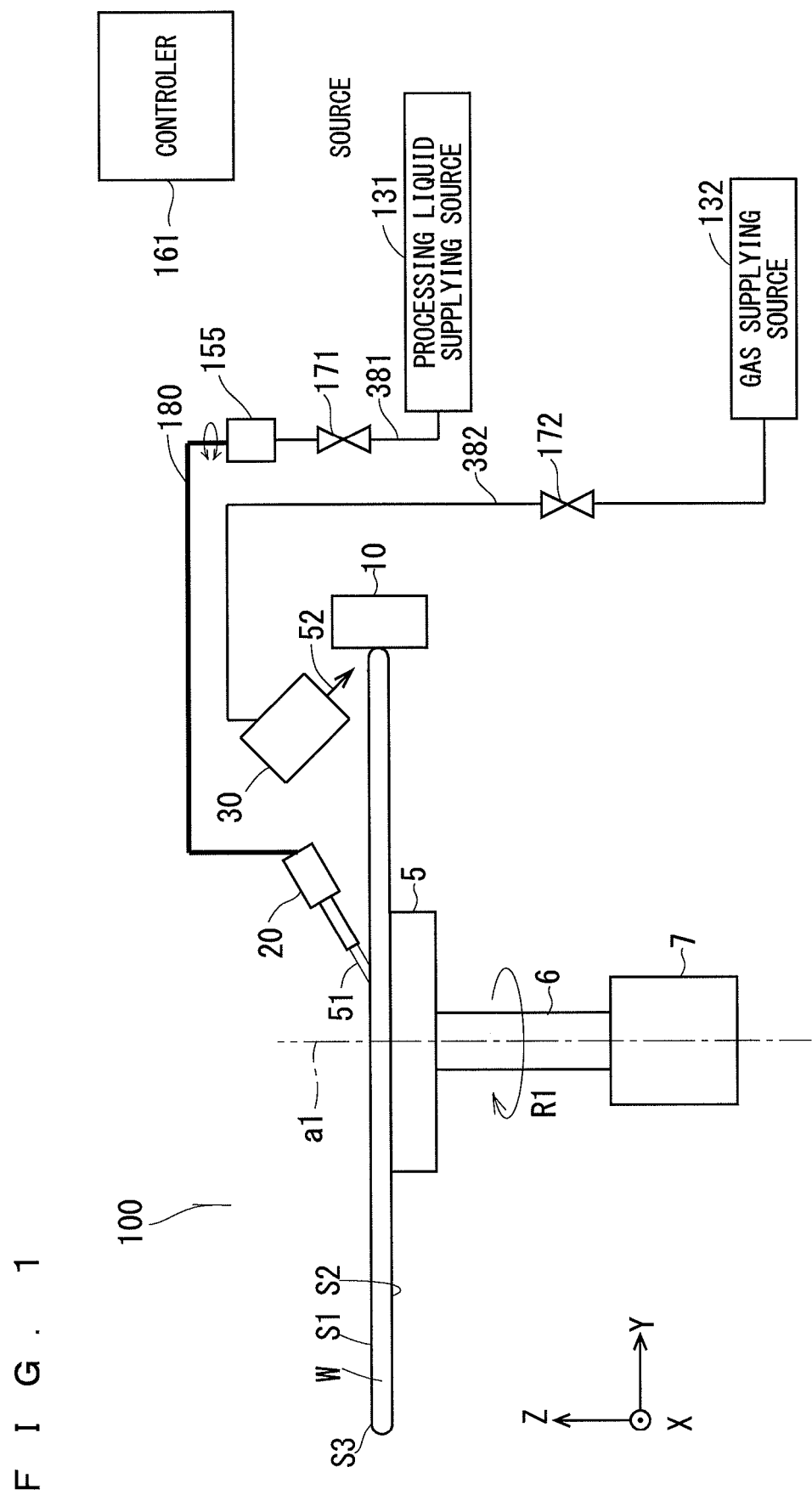
F I G. 1

F I G . 1 2
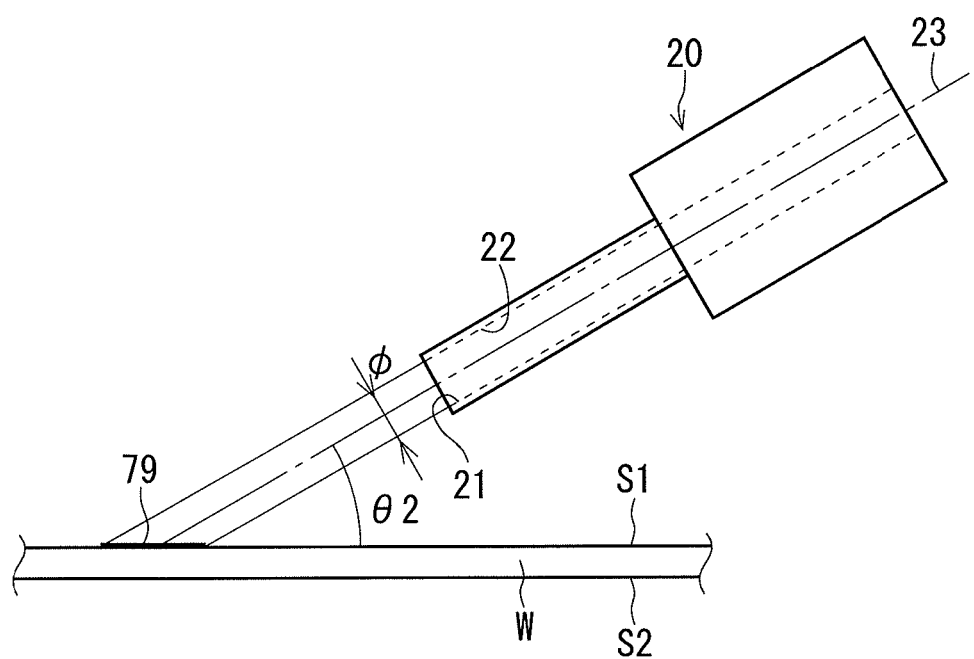

F I G . 2 0
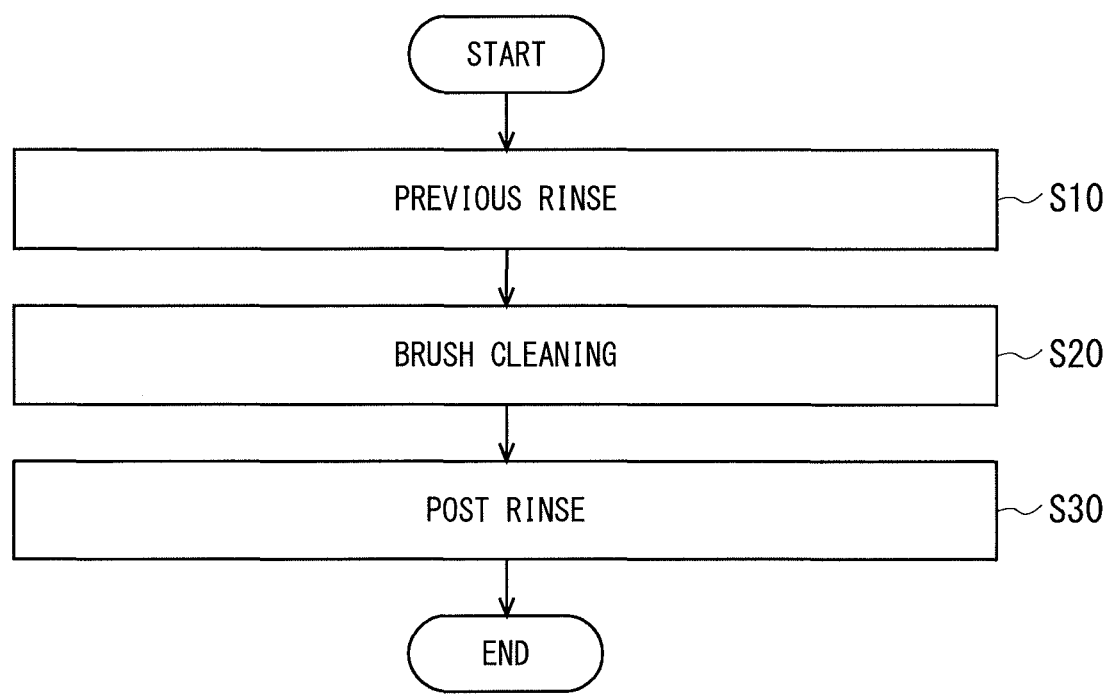

SUBSTRATE PROCESSING APPARATUS AND SUBSTRATE PROCESSING METHOD

CROSS-REFERENCE TO RELATED APPLICATIONS

The present patent application is a divisional of prior U.S. patent application Ser. No. 14/557,773, filed Dec. 2, 2014, by Takayuki NISHIDA, Akio HASHIZUME, Junichi ISHII entitled "SUBSTRATE PROCESSING APPARATUS AND SUBSTRATE PROCESSING METHOD," which claims priority of Japanese Patent Application Nos. JP2013-249734, filed Dec. 3, 2013 and JP2013-249735, filed Dec. 3, 2013. The contents of each of the patent applications listed above are incorporated in full herein by reference.

BACKGROUND OF THE INVENTION

Field of the Invention

The present invention relates to a substrate processing technique for processing a peripheral edge part of a substrate.

Description of the Background Art

As a substrate processing apparatus for performing such processing, for example, Japanese Patent Application Laid-Open No. 2006-278592 discloses an apparatus for causing a cylindrical brush to abut on a peripheral edge part of a substrate to carry out processing for cleaning the peripheral edge part while discharging a processing liquid onto a central part of an upper surface of the rotating substrate from above. For example, Japanese Patent Application Laid-Open No. 2009-164405 discloses a substrate processing apparatus for causing a sponge member impregnated with a processing liquid to abut on a peripheral edge part of a substrate, thereby supplying the processing liquid to the peripheral edge part, and at the same time, causing a blush to abut on the peripheral edge part, thereby cleaning the peripheral edge part at a position different from a position of the sponge member.

However, the substrate processing apparatus disclosed in the Japanese Patent Application Laid-Open No. 2006-278592 has the following problem. More specifically, the processing liquid is supplied to a non-processing region other than the peripheral edge part on the upper surface of the substrate in addition to the peripheral edge part to be cleaned by the brush. For this reason, a device pattern formed in the non-processing region is damaged. This is a problem caused not only in the cleaning processing but in general processing to be performed in the peripheral edge part of the substrate by using the processing liquid. Furthermore, the substrate processing apparatus disclosed in the Japanese Patent Application Laid-Open No. 2009-164405 has the following problem. More specifically, the processing liquid is caused to leak out of the sponge member and is thus supplied to the peripheral edge part. For this reason, the processing liquid lacks so that the peripheral edge part is cleaned insufficiently and a pollutant scraped off by the brush cannot be sufficiently cleaned away.

SUMMARY OF THE INVENTION

The present invention is directed to substrate processing for processing a peripheral edge part of a substrate.

According to a first aspect of the present invention, a substrate processing apparatus includes the following members: a substrate rotating mechanism for holding and rotating a substrate; a discharging portion for discharging a processing liquid to an upper surface peripheral edge part in an upper surface of the substrate which is being rotated by the substrate rotating mechanism; a moving portion for moving the discharging portion; and a controller for controlling each of operations of the discharging portion and the moving portion. The discharging portion includes a discharging port for discharging the processing liquid and a passage for supplying the processing liquid to the discharging port in communication with the discharging port, the controller controls the discharging portion and the moving portion in such a manner that the discharging portion starts to discharge the processing liquid at a first position above the substrate and is moved to a second position which is closer to a rotating axis of the substrate than the first position while discharging the processing liquid, and continuously discharges the processing liquid at the second position, the first position is a position of the discharging portion where a section of the passage in a discharging port part of the discharging portion is projected onto a first region in a rotating track of the upper surface peripheral edge part in an axial direction of the passage in the discharging port part, the second position is a position of the discharging portion where the section of the passage is projected onto a second region in the rotating track in the axial direction of the passage, and the first region is a region on a peripheral edge side of the substrate from the second region.

The discharging portion starts to discharge the processing liquid at the first position and is moved to the second position which is closer to the rotating axis of the substrate than the first position while carrying out the discharge, and continuously carries out the discharge at the second position. The processing liquid is discharged from the discharging port in the axial direction of the passage in the discharging port part of the discharging portion. For this reason, the processing liquid is discharged from the discharging portion at the first position toward the first region in the rotating track of the upper surface peripheral edge part, and is discharged from the discharging portion at the second position toward the second region of the rotating track. At the start of the discharge, a shape of a liquid column of the discharged processing liquid is more unstable as compared with that in the case in which the discharge is continuously carried out. For this reason, the processing liquid discharged toward the first region is also discharged to a periphery of the first region in some cases. The first region is a region on the peripheral edge side of the substrate from the second region. During the movement to the second position and the discharging operation at the second position, the discharging portion continuously carries out the discharging operation. Therefore, the processing liquid is discharged in a more stable shape of the liquid column than that at the start of the discharge. Accordingly, it is possible to restrain the adhesion of the processing liquid to the non-processing region due to the splash of the processing liquid on the upper surface of the substrate or the spread of the processing liquid on the upper surface of the substrate.

According to another aspect of the present invention, the substrate processing apparatus includes the following members: a substrate rotating mechanism for holding and rotating a substrate; a discharging portion for discharging a processing liquid to an upper surface peripheral edge part in an upper surface of the substrate which is being rotated by the substrate rotating mechanism; and a cleaning portion for abutting on the upper surface peripheral edge part of the substrate which is being rotated by the substrate rotating mechanism, thereby cleaning the upper surface peripheral edge part, and the discharging portion discharges the processing liquid toward a main discharging region which is predefined in a semicircular region at a downstream side in a rotating direction of the substrate with respect to the cleaning portion in a rotating track of the upper surface peripheral edge part.

The discharging portion discharges the processing liquid toward the main discharging region which is predefined in the semicircular region at the downstream side in the rotating direction of the substrate with respect to the cleaning portion in the rotating track of the upper surface peripheral edge part of the substrate. Accordingly, a range in which the processing liquid is removed to bring a dry state by the cleaning portion in the upper surface peripheral edge part is reduced as compared with the case in which the processing liquid is discharged to an upstream side in the rotating direction of the substrate with respect to the cleaning portion, for example. Accordingly, the upper surface peripheral edge part of the substrate can be cleaned more reliably.

The present invention is also directed to a substrate processing method of processing a peripheral edge part of a substrate.

Therefore, it is an object of the present invention to provide a substrate processing technique capable of preventing a processing liquid from adhering to a non-processing region other than an upper surface peripheral edge part of an upper surface of a substrate. Moreover, it is another object of the present invention to provide a cleaning technique capable of more reliably cleaning the upper surface peripheral edge part of the upper surface of the substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a side view typically showing an example of a schematic structure of a substrate processing apparatus according to a preferred embodiment;

FIG. 12 is a side view showing an example of a schematic structure of the discharging portion;

FIG. 20 is a flowchart showing an example of the operation for cleaning the substrate processing apparatus.

DESCRIPTION OF THE PREFERRED EMBODIMENTS

Figure 2:
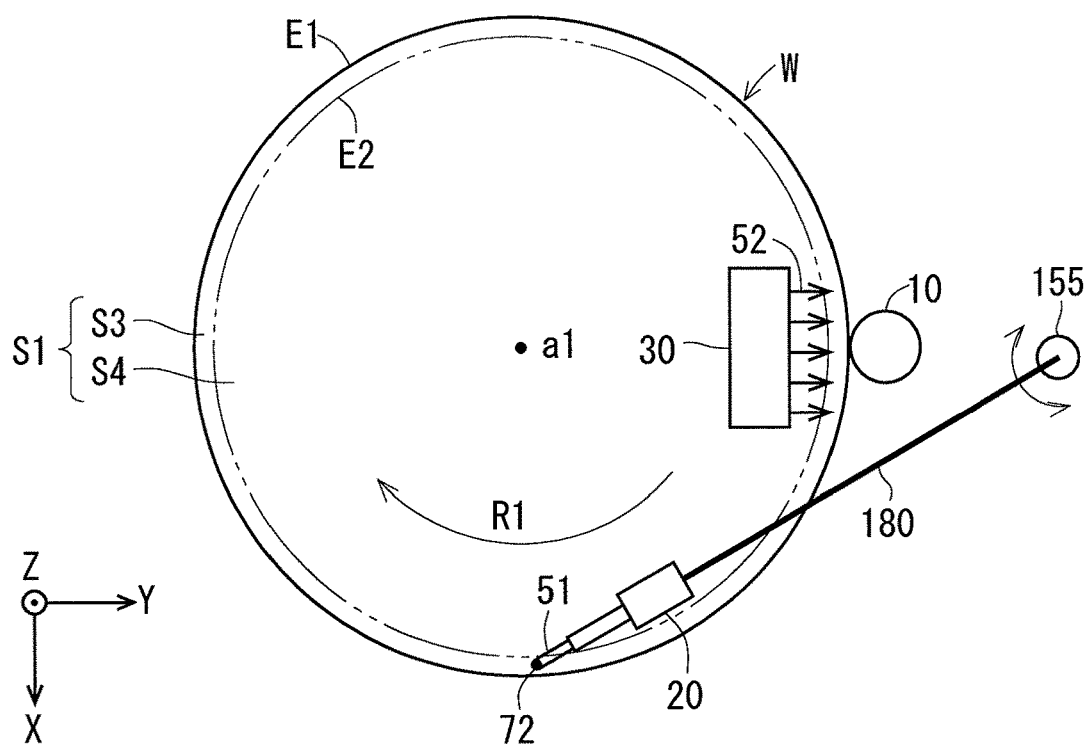
FIG. 2 is a top view showing the substrate processing apparatus of FIG. 1.

A preferred embodiment according to the present invention will be described below with reference to the drawings. In the drawings, portions having the same structures and functions are indicated by the same designations, and repetitive explanation will be omitted in the following description. Moreover, each of the drawings is schematically shown. For easiness in understanding, dimensions or numbers of the respective portions are exaggerated or simplified for illustration in some cases. In a part of the drawings, furthermore, XYZ orthogonal coordinate axes are properly given to explain a direction. The Z axis in the coordinate axis indicates a vertical direction (a +Z side is an upper side) and an XY plane is a horizontal plane.

1. Whole Structure of Substrate Processing Apparatus

FIG. 1 is a view typically showing an example of a schematic structure of a substrate processing apparatus 100 according to a preferred embodiment. FIG. 2 is a top view showing the substrate processing apparatus 100. The substrate processing apparatus 100 supplies a processing liquid 51 such as pure water to a processing region (which is also referred to as an "upper surface peripheral edge part") S3 having a determined width from a peripheral edge (which is also referred to as an "end edge" or a "peripheral end edge") E1 in an upper surface (which is also referred to as a "front surface") S1 of a substrate W such as a semiconductor wafer and performs determined processing over the processing region S3 by using the processing liquid 51.

The pure water is used for the processing liquid 51, for example. The processing liquid 51 is not limited to the pure water, but may be functional water such as carbonated water, ion water, ozone water, reduced water (hydrogen water) or magnetic water, or chemicals such as ammonia water or a mixed solution of ammonia water and hydrogen peroxide water. The processing region S3 is a ring-shaped region having a width of 1.5 to 3.0 mm from the peripheral edge E1 of the substrate W in the upper surface S1 of the substrate W, for example. A lower surface S2 on an opposite side to the upper surface S1 is also referred to as a "back surface". The substrate W takes an approximately circular surface shape which has a diameter of 300 mm, for example. A non-processing region S4 other than the processing region S3 of the upper surface S1 of the substrate W represents a device formation surface where a device pattern is formed.

The substrate processing apparatus 100 includes a spin chuck ("a substrate rotating mechanism") 5 for adsorbing and holding the substrate W in an approximately horizontal condition and rotating the substrate W in a direction of an arrow R1, a rotating spindle 6 which is provided on a lower surface of the spin chuck 5 and is rotatable with the spin chuck 5 supported, and a motor 7 which is coupled to the rotating spindle 6 and rotatively drives the rotating spindle 6, thereby rotatively driving the spin chuck 5 and the substrate W around a rotating axis a1.

Moreover, the substrate processing apparatus 100 includes a discharging portion 20 capable of discharging the processing liquid 51, a moving portion 155 for moving the discharging portion 20, and a processing liquid supplying source 131 for supplying the processing liquid 51 to the discharging portion 20. The discharging portion 20 discharges the processing liquid 51 to the processing region S3 of the substrate W which is being rotated by the spin chuck 5. The moving portion 155 is provided with a motor at a side of the substrate W held on the spin chuck 5. A cylindrical piping arm 180 is connected to an upper end of the discharging portion 20. The piping arm 180 has rigidity and can supply the processing liquid 51 to the discharging portion 20. The other end side of the piping arm 180 penetrates the moving portion 155 to reach a lower surface thereof.

The moving portion 155 turns the piping arm 180 in an approximately horizontal plane around the moving portion 155 by means of a motor, thereby retreating the discharging portion 20 to an external retreating position of a conveyance passage in delivery of the substrate W to the spin chuck 5. When the discharging portion 20 discharges the processing liquid to the processing region S3, the moving portion 155 turns the piping arm 180, thereby positioning the discharging portion 20 at a position above the substrate W where the discharging portion 20 can discharge the processing liquid 51 to a predetermined region on the processing region S3. Furthermore, the moving portion 155 turns the piping arm 180, thereby moving the discharging portion 20 which is discharging the processing liquid 51 above the substrate W in order to move, over the processing region S3, the region to which the processing liquid 51 is to be discharged. The positioning and movement can be accurately carried out by servo control in the discharge of the processing liquid 51 through the discharging portion 20. The servo control is carried out by a controller 161. Therefore, it is possible to adjust the position of the discharging portion 20 in accordance with a command sent from the controller 161.

One end of a pipe 381 is connected to the other end of the piping arm 180 penetrating the moving portion 155. The pipe 381 is provided through the processing liquid supplying source 131. The other end of the pipe 381 is connected to the processing liquid supplying source 131 and an opening/closing valve 171 is provided in a middle part. The processing liquid supplying source 131 supplies the stored processing liquid 51 to the discharging portion 20 through the pipe 381 and the piping arm 180 by means of a pump or the like. The opening/closing operation of the opening/closing valve 171 is controlled by the controller 161.

Moreover, the substrate processing apparatus 100 includes a cleaning portion 10 for cleaning the processing region S3 of the substrate W, a gas injecting portion 30 for injecting a gas 52 to an upper surface S1 of the substrate W, a gas supplying source 132 for supplying the stored gas 52 to the gas injecting portion 30 by means of a pump or the like, and a pipe 382 for connecting the gas injecting portion 30 and the gas supplying source 132 in communication. An opening/closing valve 172 is provided in a middle of the pipe 382. The opening/closing valve 172 is controlled to be opened/closed by the controller 161. The processing liquid supplying source 131 and the gas supplying source 132 may be provided on an outside of the substrate processing apparatus 100.

The cleaning portion 10 scrapes off and removes an adhering substance (a "pollutant") such as a particle or a processing liquid adhering to the processing region S3 of the substrate W in abutment on the processing region S3 of the substrate W which is being rotated by the spin chuck 5, thereby cleaning the processing region S3. The cleaning portion 10 is configured rotatably and has flexibility. The cleaning portion 10 is formed by a cylindrical brush or a porous member, for example, a member such as a sponge. The cleaning portion 10 abuts on the processing region S3 of the substrate W with an axial direction parallel with the rotating axis a1 of the substrate W. The cleaning portion 10 is rotated by a rotating mechanism not shown and is thus rotated around the axis of the cleaning portion 10. Moreover, the cleaning portion 10 is positioned by means of a moving mechanism not shown at an abutting position where the cleaning portion 10 abuts on the processing region S3 of the substrate W and a separating position where the cleaning portion 10 separates from the processing region S3, respectively. The cleaning portion 10 abuts on the substrate W in a state in which the cleaning portion 10 breaks into the peripheral edge E1 of the substrate W, which is illustrated with simplification for easiness in understanding in FIGS. 1 to 3. Furthermore, the cleaning portion 10 can clean the processing region S3 in a state in which the discharging portion 20 discharges the processing liquid 51 to the processing region S3, and furthermore, can clean the processing region S3 in a state in which the processing liquid 51 is not discharged.

Figure 6:
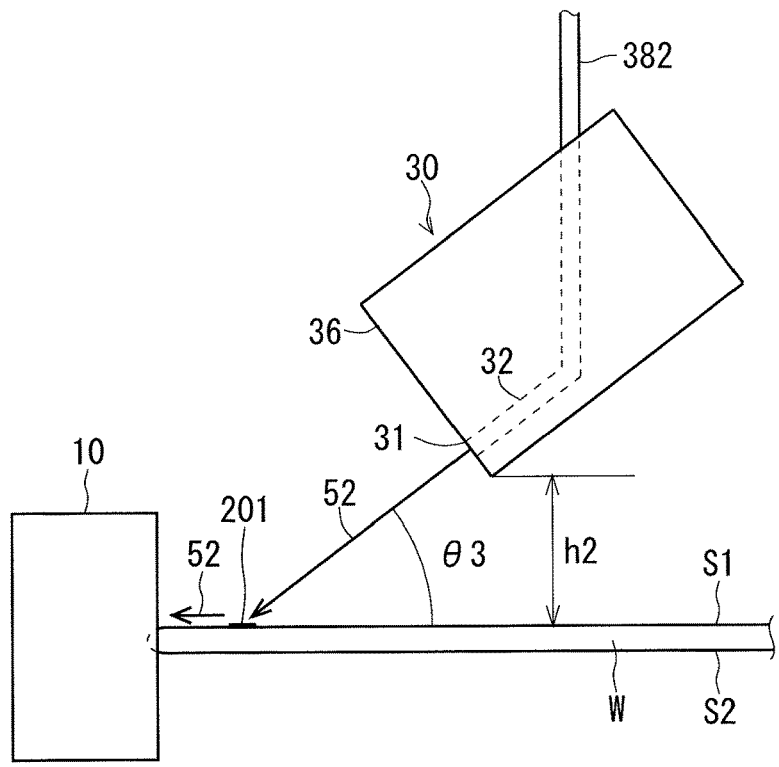
FIG. 6 is a side view typically showing an example of a schematic structure of a gas injecting portion.

FIG. 6 is a side view typically showing an example of a schematic structure of the gas injecting portion 30. As shown in FIGS. 1, 2 and 6, the gas injecting portion 30 is provided above a portion between the cleaning portion 10 and the rotating axis a1 of the substrate W in the upper surface S1 of the substrate W. The gas injecting portion 30 includes a body taking a shape of a rectangular parallelepiped, an injecting port 31 provided on a side surface 36 opposed to the cleaning portion 10 in the body, and a passage 32 for causing the injecting port 31 and a pipe 382 to communicate with each other. A height h2 of a lower end of the gas injecting portion 30 with respect to the upper surface 51 of the substrate W is set to be 25 mm, for example. The shape of the gas injecting portion 30 is not restricted to the rectangular parallelepiped but various shapes are employed.

The gas injecting portion 30 injects the gas 52 onto the upper surface 51 of the substrate W from above the substrate W toward a predefined injecting target region 201 in an axial direction of the passage 32 in the injecting port 31 portion. Consequently, a flow of the gas 52 (that is, a gas flow) from the injecting target region 201 toward the cleaning portion 10 side is generated on the substrate W. An angle θ3 formed by an injecting direction of the gas 52 and the upper surface 51 of the substrate W is set to be 45°, for example.

The substrate processing apparatus 100 can prevent scattering, to the non-processing region S4, of the pollutant scraped off by the cleaning portion 10 or mist of the processing liquid 51 which is generated by the rotation of the cleaning portion 10 or the like and their adhesion to the non-processing region S4 through the flow of the gas 52 from the injecting target region 201 toward the cleaning portion 10 side. The gas injecting portion 30 injects a nitrogen gas or the like as the gas 52, for example. It is also possible to inject a dry gas such as dry air or an inert gas other than a nitrogen gas in addition to the nitrogen gas.

As shown in FIG. 1, moreover, the substrate processing apparatus 100 is electrically connected to components provided in the substrate processing apparatus 100 and provided with the controller 161 for controlling the components. Specifically, the controller 161 includes a computer or the like in which a CPU for carrying out various arithmetic processing, an ROM for storing a program or the like, an RAM serving as a work area for the arithmetic processing, a hard disk for storing a program, various data files and the like, a data communicating unit having a data communicating function through an LAN and the like are connected to each other by a bus or the like. Moreover, the controller 161 is connected to an input portion including a display, a keyboard, a mouse and the like which perform various display operations. In the substrate processing apparatus 100, predetermined processing is executed over the substrate W under control of the controller 161.

The substrate processing apparatus 100 may perform rinse processing which is not followed by the cleaning of the cleaning portion 10, etching processing using an etchant as the processing liquid 51 or the like. In this case, the substrate processing apparatus 100 always needs neither the cleaning portion 10 nor the gas injecting portion 30.

2. Region where Discharging Portion Discharges Processing Liquid

Figure 3:
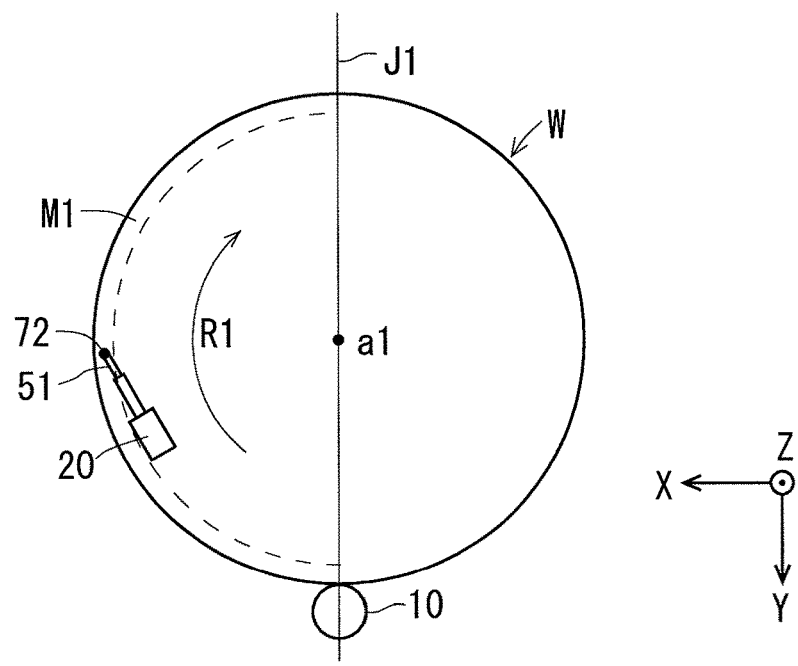
FIG. 3 is a top view for explaining a region onto which a discharging portion discharges a processing liquid.

FIG. 3 is a top view for explaining a region where the discharging portion 20 discharges the processing liquid 51 to the processing region S3. As shown in FIG. 3, the discharging portion 20 discharges the processing liquid 51 toward a second region (a "main discharging region") 72 which is predefined in a semicircular region M1 (which will be described below) at a downstream side in a rotating direction of the substrate W with respect to the cleaning portion 10, and the semicircular region M1 is in a rotating track of the processing region S3. Accordingly, as compared with the case in which the processing liquid 51 is discharged to an upstream side in the rotating direction of the substrate W with respect to the cleaning portion 10, for example, a range in which the processing liquid 51 is removed to bring a dry state by the cleaning portion 10 in the processing region S3 is reduced. Therefore, the processing region S3 of the upper surface S1 can be cleaned more reliably. The semicircular region M1 is provided on the downstream side in the rotating direction of the substrate W with respect to the cleaning portion 10 in two semicircular regions into which the rotating track of the processing region S3 is divided by a plane J1 passing through the cleaning portion 10 and the rotating axis a1 of the substrate W.

As the second region 72 is closer to the cleaning portion 10 in the rotating track of the processing region S3, a region where the processing liquid 51 is removed by the cleaning portion 10 and dried in the processing region S3 is reduced. Accordingly, it is more preferable that the second region 72 should be closer to the cleaning portion 10 at the downstream side in the rotating direction of the substrate W with respect to the cleaning portion 10. When the processing liquid 51 is directly discharged to the cleaning portion 10, however, the processing liquid 51 splashes over an outer peripheral surface of the cleaning portion 10 so that the non-processing region S4 might be contaminated. For this reason, the second region 72 is previously defined in a different region from the region where the cleaning portion 10 abuts on the substrate W.

3. Discharging Direction of Discharging Portion

Figure 4:
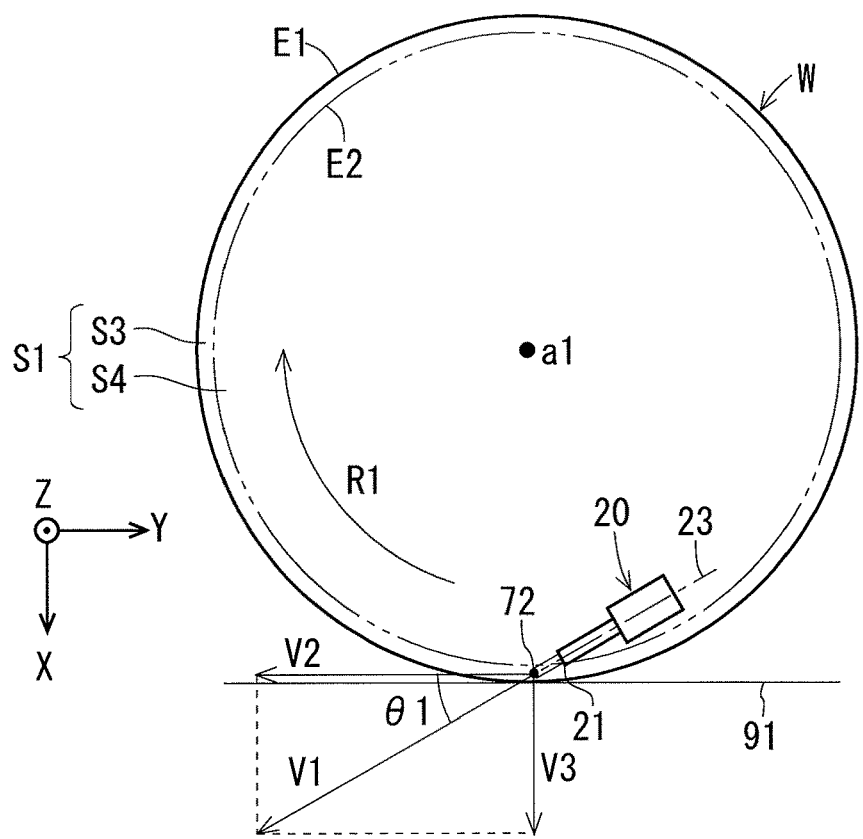
FIG. 4 is a top view for explaining a discharging direction of the processing liquid through the discharging portion.
Figure 5:
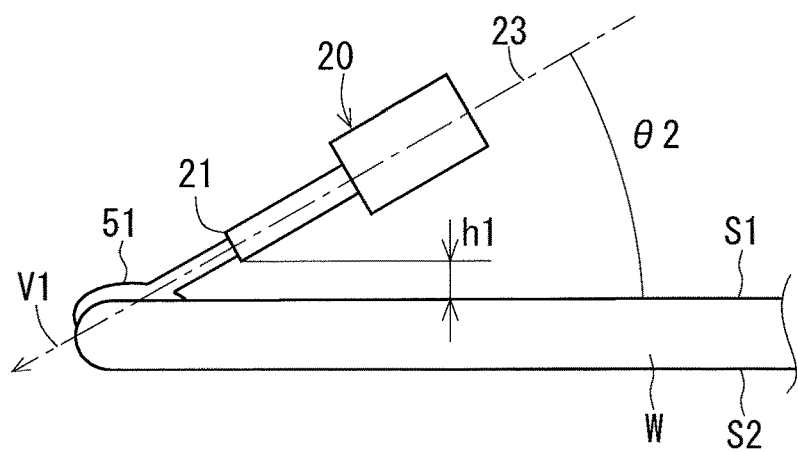
FIG. 5 is a side view for explaining the discharging direction of the processing liquid through the discharging portion.

FIGS. 4 and 5 are top and side views for explaining a discharging direction V1 in the discharge of the processing liquid 51 by the discharging portion 20. The processing liquid 51 is discharged from the discharging port 21 of the discharging portion 20. A passage 22 (see FIG. 12) is provided in the discharging portion 20. The passage 22 causes the discharging port 21 and the piping arm 180 connected to an upper part of the discharging portion 20 to communicate with each other. The processing liquid 51 is discharged in the discharging direction V1 along a direction of an axis (a central axis) 23 in the discharging port 21 portion in the passage 22.

As shown in FIG. 4, preferably, the discharging direction V1 is an oblique direction having a component V2 and a component V3. The component V2 is turned toward the downstream in the rotating direction of the substrate W along a tangential line 91 in a proximity part to the second region 72 in the peripheral edge E1 of the substrate W as seen in the direction of the rotating axis a1 of the substrate W from above the discharging portion 20. The component V3 is turned from a central side (the rotating axis a1 side) of the substrate W in an orthogonal direction to the tangential line 91 toward the peripheral edge E1 side. Accordingly, the processing liquid 51 discharged to the processing region S3 is prevented from adhering to the non-processing region S4 due to the splash or the spread up to the non-processing region S4. An angle $\theta 1$ formed by the discharging direction V1 and the tangential line 91 is preferably set to be 30°, for example. If the angle $\theta 1$ is greater than 0° and is equal to or smaller than 90°, it does not need to be 30°. The angle $\theta 1$ may be slightly greater than 90°.

When the discharging portion 20 is seen from the side of the substrate W as shown in FIG. 5, an angle $\theta 2$ formed by the discharging direction V1 and the upper surface S1 is preferably set to be 30°, for example. If the angle $\theta 2$ is greater than 0° and is equal to or smaller than 90°, it does not need to be 30°. Moreover, the angle $\theta 2$ may be slightly greater than 90°.

A height h1 of the discharging port 21 of the discharging portion 20 with respect to the upper surface S1 of the substrate W is set to be 1 mm to 3 mm, for example, and is preferably set to be 2 mm, for example. A flow rate of the processing liquid 51 is set to be 10 to 30 ml/min., for example, and is preferably set to be 20 ml/min, for example. The number of rotations of the substrate W is set to be 300 to 800 rpm, for example, and is preferably set to be 500 rpm, for example.

4. Example of Structure of Discharging Port of Gas Injecting Portion

FIGS. 7 to 10 are top views showing injecting ports 31a and 31c, and injecting ports 31b and 31d as an example of the injecting port 31 of the gas injecting portion 30, respectively. The injecting ports 31a to 31d shown in FIGS. 7 to 10 are perspective images obtained by seeing through the injecting ports 31a to 31d in the direction of the rotating axis a1 of the substrate W from above the gas injecting portion 30.

Figure 7:
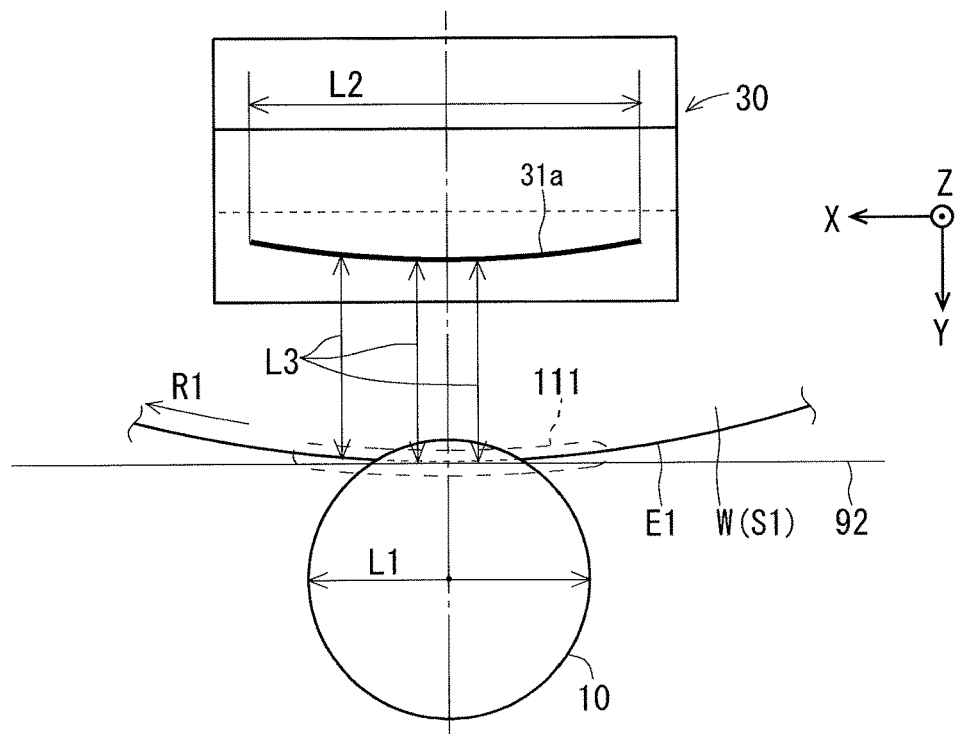
FIGS. 7, 8, 9, 10 are top views each showing an example of an injecting port of the gas injecting portion.

As shown in FIG. 7, the injecting port 31a of the gas injecting portion 30 is slit-shaped and takes a long shape in a circumferential direction of the substrate W which is curved along a proximity part to the cleaning portion 10 (for example, a part surrounded by a broken line 111) which includes an abutting part on the cleaning portion 10 in the peripheral edge E1 of the substrate W as seen through in the direction of the rotating axis a1 (the Z direction) of the substrate W from above. Consequently, respective distances L3 between respective parts of the slit-shaped injecting port 31a and the proximity part can be made substantially equal to each other as compared with the case in which the perspective image of the injecting port 31a is set along the tangential line 92.

Accordingly, a distribution along the tangential line 92 of the flow rate of the gas 52 in the proximity part can be made more uniform. In other words, the gas 52 can be supplied uniformly to the proximity part. Therefore, it is possible to prevent mist or the like from scattering from the proximity part and adhering to the non-processing region S4 of the upper surface S1 of the substrate W.

Figure 8:
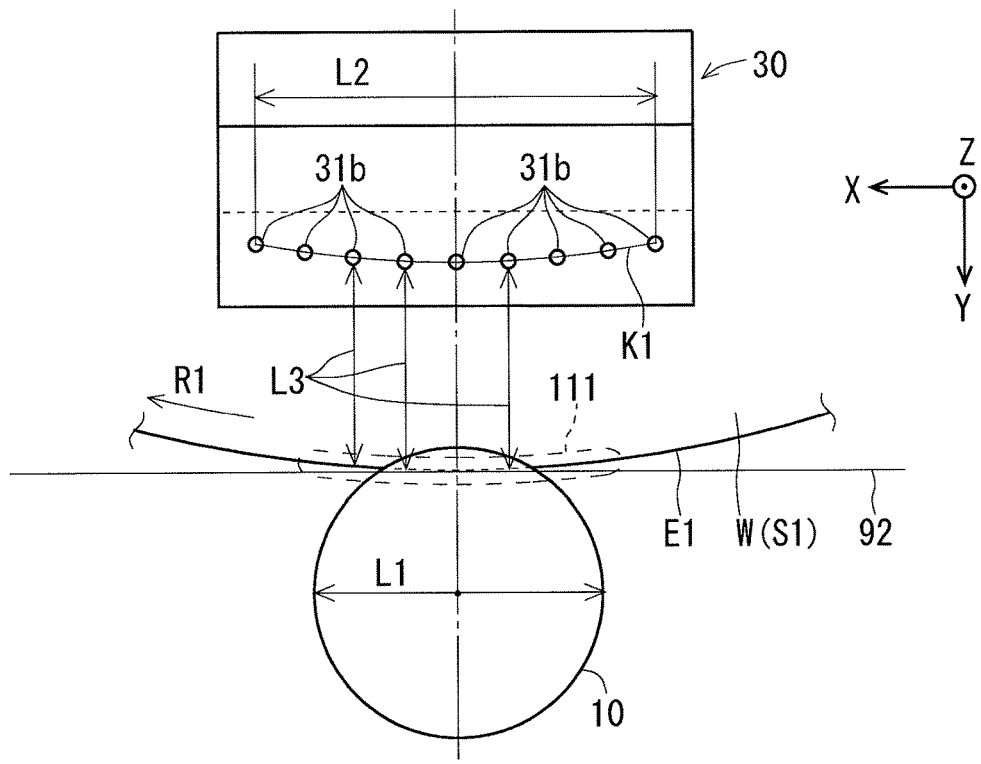

As shown in FIG. 8, the injecting ports 31b of the gas injecting portion 30 are arranged apart from each other over a virtual line K1 curved along a proximity part to the cleaning portion 10 (a part surrounded by a broken line 111, for example) including an abutting part on the cleaning portion 10 in the peripheral edge E1 of the substrate W as seen through in the direction of the rotating axis a1 of the substrate W from above the gas injecting portion 30. Consequently, the respective distances L3 between the injecting ports 31b and the proximity part can be made substantially equal to each other as compared with the case in which respective perspective images of the injecting ports 31b are arranged in the direction of the tangential line 92 in the abutting part on the cleaning portion 10 in the peripheral edge E1 of the substrate W. Accordingly, the distribution along the tangential line 92 of the flow rate of the gas 52 in the proximity part can be made more uniform. In other words, the gas 52 can be supplied uniformly to the proximity part. Therefore, it is possible to prevent mist or the like from scattering from the proximity part and adhering to the non-processing region S4 of the upper surface S1.

Figure 9:
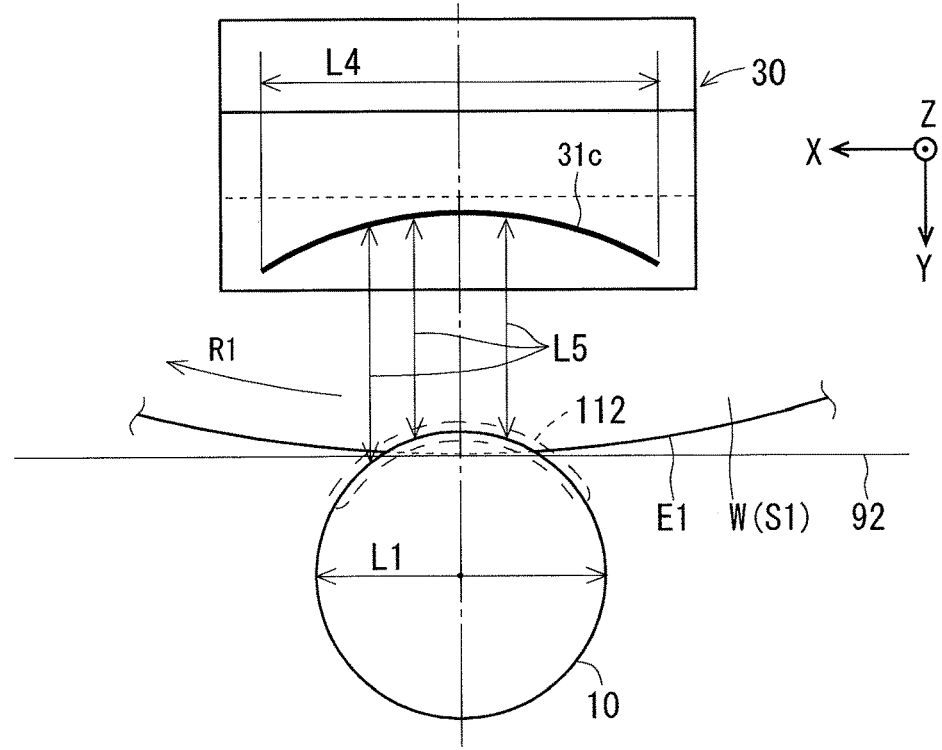

As shown in FIG. 9, the injecting port 31c of the gas injecting portion 30 is slit-shaped and takes a long shape in the circumferential direction of the cleaning portion 10 which is curved along an opposed part (for example, a part surrounded by a broken line 112) to the peripheral edge E1 of the substrate W in an outer peripheral surface of the cleaning portion 10 as seen through in the direction of the rotating axis a1 from above the gas injecting portion 30. Consequently, respective distances L5 between respective parts of the slit-shaped injecting port 31c and the opposed part in the outer peripheral surface of the cleaning portion 10 can be made substantially equal to each other as compared with the case in which the perspective image of the injecting port 31c is long in the direction of the tangential line 92 in the abutting part on the cleaning portion 10 in the peripheral edge E1 of the substrate W. Accordingly, the gas 52 can be supplied uniformly to a contact position of the cleaning portion 10 with the substrate W from a periphery of the cleaning portion 10. Therefore, it is possible to prevent mist or the like from scattering from the cleaning portion 10 and adhering to the non-processing region S4 of the upper surface S1.

Figure 10:
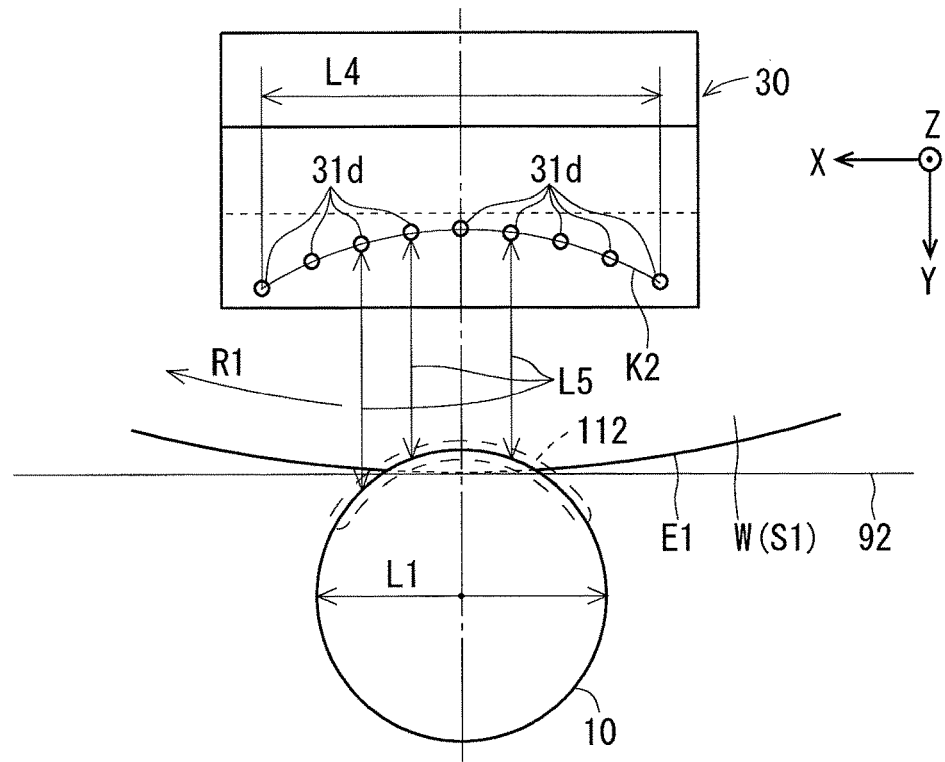

As shown in FIG. 10, the injecting ports 31d of the gas injecting portion 30 are arranged apart from each other over a virtual line K2 curved along the opposed part (the part surrounded by the broken line 112, for example) to the peripheral edge E1 of the substrate W in the outer peripheral surface of the cleaning portion 10 as seen through in the direction of the rotating axis a1 from above the gas injecting portion 30. Consequently, the respective distances L5 between the injecting ports 31d and the opposed portion can be made substantially equal to each other as compared with the case in which the respective perspective images of the injecting ports 31d are arranged in the direction of the tangential line 92 in the abutting part on the cleaning portion 10 in the peripheral edge E1. Accordingly, the gas 52 can be supplied uniformly to the contact position of the cleaning portion 10 with the substrate W from the periphery of the cleaning portion 10. Therefore, mist generated from the cleaning portion 10 can be prevented from scattering to the non-processing region S4 of the upper surface S1.

Hole diameters (diameters) of the injecting ports 31b and 31d are preferably set to be 0.5 mm to 1.0 mm. The numbers of the injecting ports 31b and 31d are set to be 5 to 10, respectively. The shapes of the injecting ports 31b and 31d are not restricted to a circle but a shape other than the circle, for example, a square may be employed, for example. Widths of the injecting ports 31a and 31c may be preferably set to be 0.5 mm to 1.0 mm, and lengths L2 and L4 of the injecting ports 31a and 31c along the tangential line 92 are preferably set to be approximately 40 mm.

Figure 11:
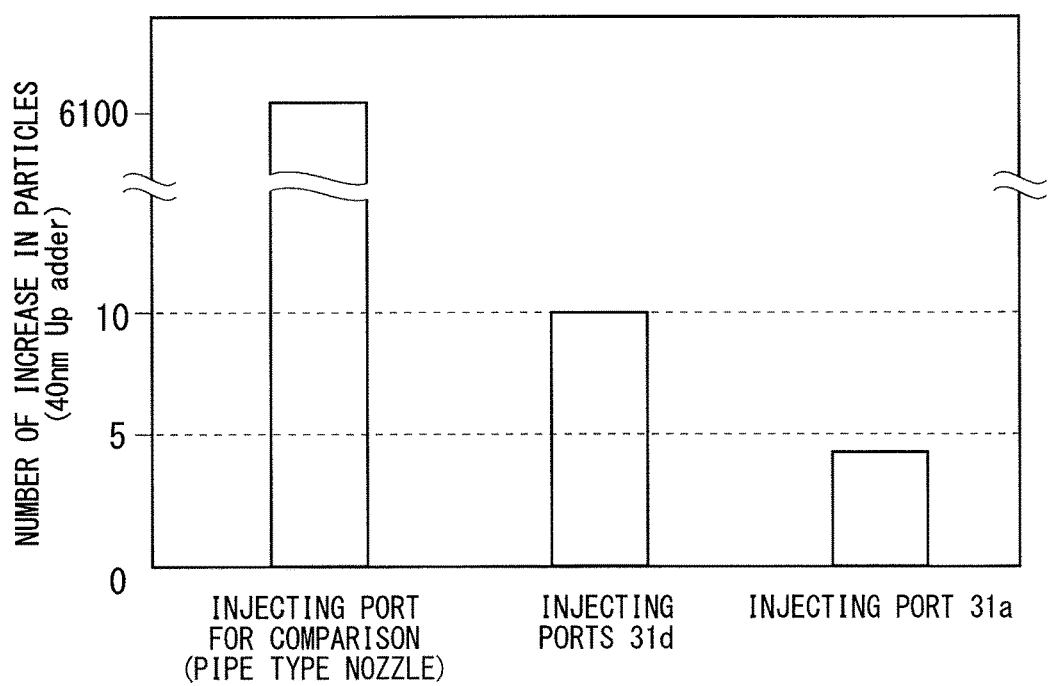
FIG. 11 is a graph showing an example of a relationship between a structure of the injecting port and the number of increase in particles.

FIG. 11 is a bar graph showing an example of a relationship between the structure of the injecting port of the gas injecting portion 30 and the number of increase in particles adhering to the non-processing region S4 over the whole periphery of the substrate W. More specifically, an axis of abscissa of the graph shown in FIG. 11 indicates configurations of three types of injecting ports. An axis of ordinate indicates the number of increase in particles adhering to the non-processing region S4 over the whole periphery of the substrate W after the cleaning portion 10 performs the processing for cleaning the processing region S3 while the gas injecting portion 30 injects the gas 52 to each of the injecting ports shown in the axis of abscissa, respectively. The particle to be counted has a diameter of 40 nm or more.

One of the three types of injecting ports shown in the axis of abscissa which is provided on a left end is the injecting port according to the comparative art. More specifically, the injecting port takes a circular shape at a lower end of a pipe-shaped nozzle extended straight in a vertical direction with respect to the upper surface S1 of the substrate W. The injecting ports on a center and a right end of the axis of abscissa are the injecting ports 31d and 31a. The injecting ports 31d and 31a have the angle θ3 set to be 45° and the injecting port according to the comparative art has the angle θ3 set to be 90°, and all of the discharging ports have the heights h2 from the upper surface S1 set to be 25 mm. The flow rates of the gas 52 injected from the injecting port according to the comparative art and the injecting ports 31d and 31a (for the injecting ports 31d, a total flow rate of the gas 52 injected from each of them) are 100 NL/min., 170 NL/min. and 190 NL/min.

As shown in FIG. 11, the numbers of increase in particle for the injecting port according to the comparative art and the injecting ports 31d and 31a are 6136, 8 to 10, and 4 to 5, respectively. Even if any of the injecting port 31a and the injecting ports 31d is employed as the injecting port 31 of the gas injecting portion 30 according to the preferred embodiment, the number of increase in particles is considerably decreased as compared with the discharging port according to the comparative art.

In comparison between the injecting port 31a and the injecting ports 31d, the injecting port 31a has the number of increase in particles improved to be an approximately half of the numbers of the injecting ports 31d. Furthermore, a result of measurement for the injecting port 30c which is not shown is improved, that is, the number is substantially equal to or slightly smaller than the numbers of the injecting ports 31d. The reason is as follows. The injecting port 31c is slit-shaped. For this reason, the flow of the gas 52 is made more uniform as compared with the injecting port 31d provided discretely. Moreover, a result of measurement for the injecting port 31b which is not shown is substantially equal to or is slightly larger than the number of increase in particles of the injecting port 31a. The reason is that the uniformity of the flow of the gas 52 in the injecting ports 31b is slightly deteriorated as compared with the injecting port 31a. Accordingly, the injecting ports 31d are preferably employed as the injecting port 31 of the gas injecting portion 30, the injecting port 31c is more preferably employed, the injecting ports 31b are further preferably employed, and the injecting port 31a is further preferably employed.

An injecting target region 201 of the gas injecting portion 30 shown in FIG. 6 (a line of the respective injecting target regions 201 corresponding to the injecting ports in the case in which the gas injecting portion 30 includes the injecting ports) is defined on the upper surface S1 of the substrate W so as to be opposed to the portion where the cleaning portion 10 in the processing region S3 of the substrate W abuts. The injecting target region 201 may include the inner peripheral edge E2 (FIG. 2) of the rotating track of the processing region S3, may be defined on a central side (the rotating axis a1 side) of the substrate W from the inner peripheral edge E2 or may be defined on the peripheral edge (outer peripheral edge) E1 side from the inner peripheral edge E2. The injecting target region 201 is preferably defined to include the inner peripheral edge E2 of the rotating track of the processing region S3 and is more preferably defined in the vicinity of the rotating track of the processing region S3 at the central side of the substrate W from the inner peripheral edge E2.

When the gas flow of the gas 52 (the whole gas flow in the case of the injecting ports) is seen in the direction of the rotating axis a1 of the substrate W from above, it is preferable that the gas flow should include the whole cleaning portion 10. If the whole cleaning portion 10 is included in the gas flow, it is possible to further prevent scattering, to the non-processing region, of mist generated from the cleaning portion 10 itself by the rotation of the cleaning portion 10 in addition to mist from the abutting part. In the case in which the gas flow (the whole gas flow in the case of the injecting ports) is a parallel flow which is symmetrical with a plane including the central axis (the rotating axis) of the cleaning portion 10 and the rotating axis a1 of the substrate W, a condition for including the whole cleaning portion 10 in the gas flow corresponds to the case in which the width in the direction of the tangential line 92 of the injecting port 31 (the width L2 in the case of the injecting port 31a and the injecting ports 31b, and the width L4 in the case of the injecting port 31c and the injecting ports 31d) is greater than the diameter L1 of the cleaning portion 10.

It is more preferable that the gas flow of the gas 52 should be the parallel flow because reduction in a flow velocity of the air flow can be prevented more greatly as compared with the case in which the gas flow spreads to be fan-shaped toward the cleaning portion 10 over the substrate W. Even if the gas flow is not the parallel flow, it is possible to prevent the scattering of the mist or the like to the non-processing region, and furthermore, to prevent spread of the gas flow by causing the gas injecting portion 30 to be closer to the cleaning portion 10 side. For this reason, the usability of the present invention is not damaged. For example, the gas flow may be turned toward the rotating axis of the cleaning portion 10.

5. Change in Position of Discharging Portion in Discharging Operation

FIG. 12 is a side view showing an example of a schematic structure of the discharging portion 20. As shown in FIG. 12, the discharging portion 20 includes the discharging port 21 for discharging the processing liquid 51 and the passage 22 for causing the discharging port 21 and the piping arm 180 to communicate with each other, thereby supplying the processing liquid 51 to the discharging port 21. A diameter φ of the discharging port 21 is set to be 0.3 mm, for example. A section of the passage 22 in the discharging port 21 portion is projected onto a region 79 in the rotating track of the processing region S3 in the direction of the axis ("central axis") 23 of the passage 22 in the discharge port 21 portion.

The processing liquid 51 is discharged from the discharging port 21 in the direction of the axis 23. In the case in which the sectional shape of the passage 22 in the discharging port 21 portion is substantially constant, the processing liquid 51 discharged from the discharging port 21 takes a shape of a liquid column having a substantially identical section to the section of the passage 22 and is discharged toward the region 79. In this case, the inside diameter φ of the discharging port 21 is substantially equal to a diameter of a section of the liquid column in the processing liquid 51 which is discharged. It is preferable that a sectional shape of a vicinal part of the discharging port 21 in the passage 22 should be constant in order to prevent more expansion of the section of the liquid column in the processing liquid 51 as the processing liquid 51 discharged from the discharging port 21 goes away from the discharging port 21. The passage 22 in the discharging port 21 portion may take a sectional shape other than a circle, for example, a square.

Figure 13:
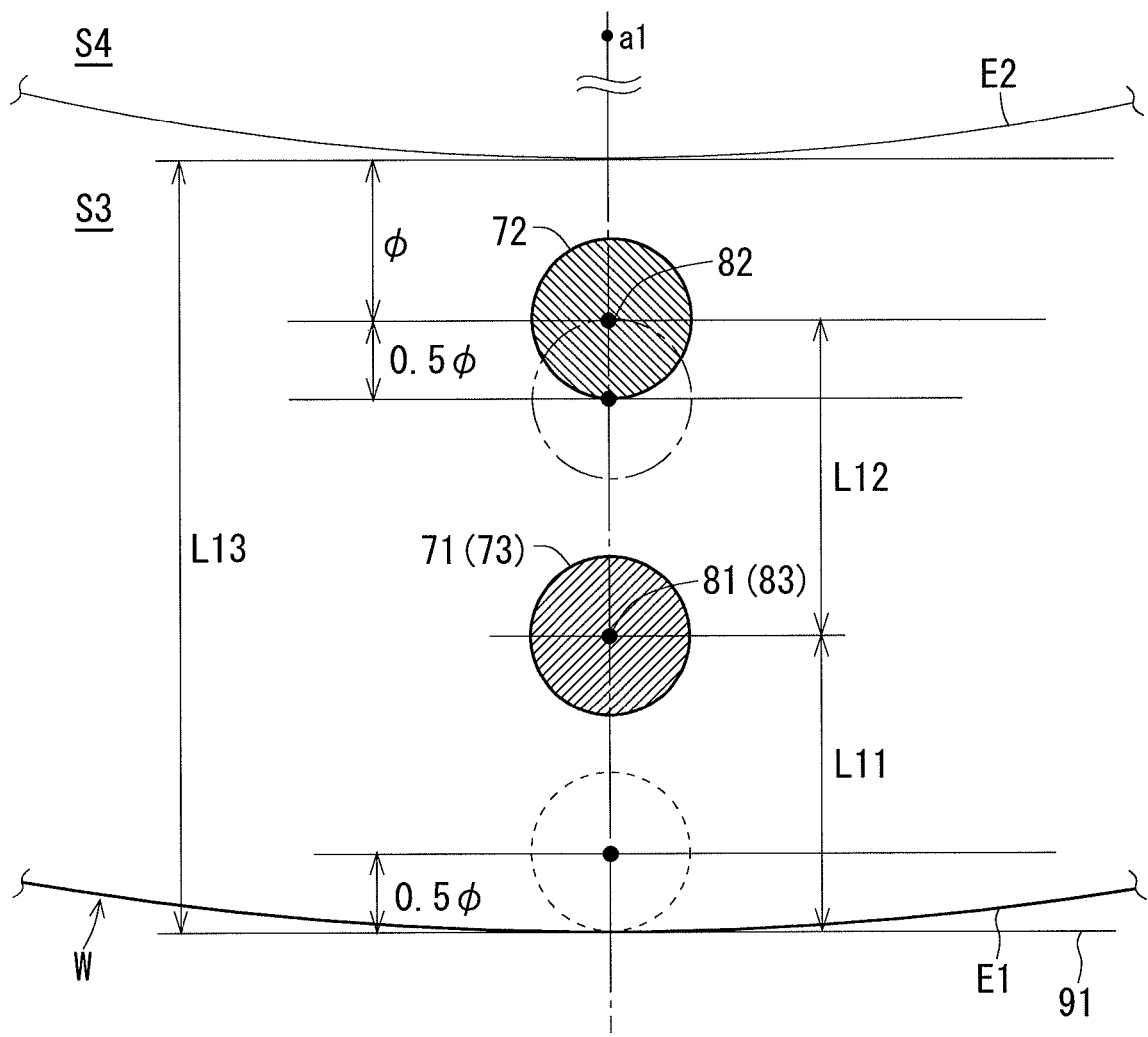
FIG. 13 is a view for explaining a region on a substrate where the discharging portion discharges the processing liquid.
Figure 14:
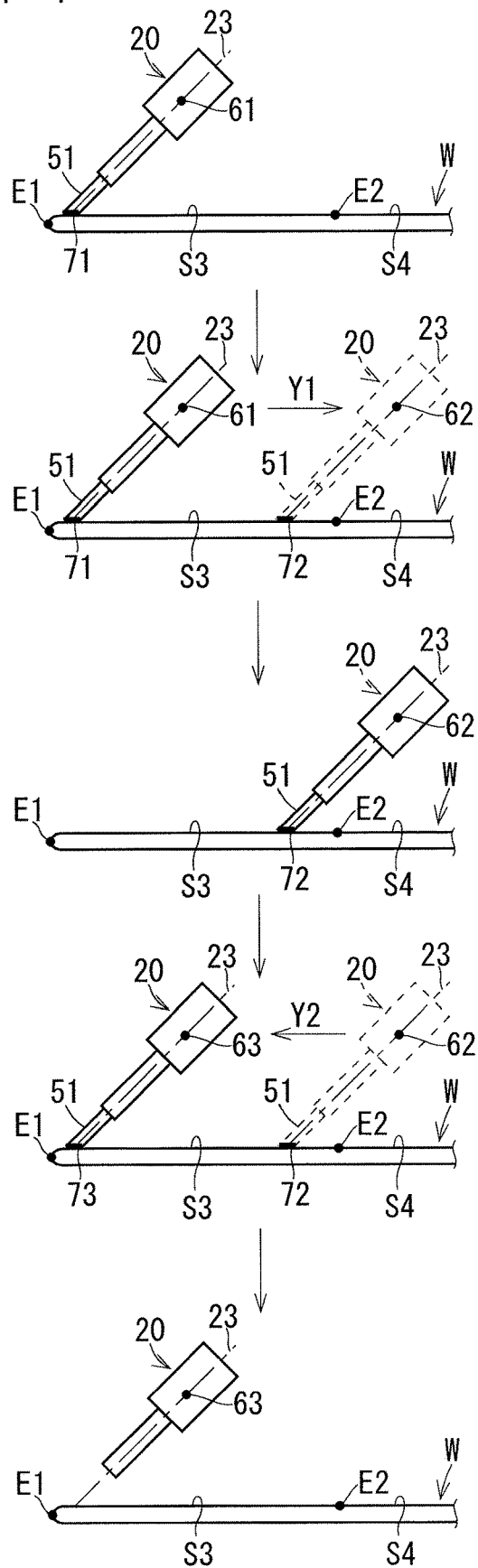
FIG. 14 is a view for showing an example of change in a position of the discharging portion in time series.

FIG. 13 is a view for explaining regions (a first region 71 for starting the discharge, a second region 72 for continuously carrying out the discharge, and a third region 73 for stopping the discharge) on the substrate W where the discharging portion 20 discharges the processing liquid 51. FIG. 14 is a view showing, in time series, an example of change at a position of the discharging portion 20 in the discharging operation of the discharging portion 20 and a region where the processing liquid 51 is discharged onto the substrate W.

The controller 161 controls the discharging portion 20 and the moving portion 155 in such a manner that the discharging portion 20 positioned at the first position 61 starts to discharge the processing liquid 51 and is moved to a second position (a "main discharging position") 62 that is closer to the rotating axis a1 of the substrate W than a first position (a "discharge starting position") 61 above the substrate W while discharging the processing liquid 51, and continuously carries out the discharge of the processing liquid 51 at the second position 62. Furthermore, the controller 161 controls the discharging portion 20 and the moving portion 155 in such a manner that the discharging portion 20 discharging the processing liquid 51 at the second position 62 is moved to a third position (a "discharge stopping position") 63 which is more distant from the rotating axis a1 of the substrate W than the second position 62 while discharging the processing liquid 51, and stops the discharge of the processing liquid 51 at the third position 63. The controller 161 controls opening/closing of the opening/closing valve 171, thereby controlling the discharging operation of the discharging portion 20, and controls a rotating operation of a motor incorporated in the moving portion 155, thereby controlling the moving portion 155 to move the discharging portion 20.

As shown in FIGS. 13 and 14, the first region 71 is a region in which the section of the passage 22 in the discharging port 21 portion of the discharging portion 20 positioned at the first position 61 is projected onto the rotating track of the processing region S3 in the direction of the axis 23 of the passage 22 in the discharging port 21 portion. The processing liquid 51 is discharged from the discharging portion 20 positioned at the first position 61 toward the first region 71.

Similarly, the second region 72 is a region in which the section of the passage 22 in the discharging port 21 portion of the discharging portion 20 positioned at the second position 62 is projected onto the rotating track of the processing region S3 in the direction of the axis 23 of the passage 22 in the discharging port 21 portion. The processing liquid 51 is discharged from the discharging portion 20 positioned at the second position 62 toward the second region 72.

Similarly, the third region 73 is a region in which the section of the passage 22 in the discharging port 21 portion of the discharging portion 20 positioned at the third position 63 is projected onto the rotating track of the processing region S3 in the direction of the axis 23 of the passage 22 in the discharging port 21 portion. The processing liquid 51 is discharged from the discharging portion 20 positioned at the third position 63 toward the third region 73. Moreover, the first region 71 and the third region 73 are provided on the peripheral edge E1 side of the substrate W from the second region 72.

In FIG. 13, the sectional shape of the passage 22 in the discharging port 21 portion is a circle and the angle θ2 (FIGS. 5 and 12) is 90 degrees. In the case in which the sectional shape is the circle and the angle θ2 is not 90 degrees, the first region 71 (the third region 73) and the second region 72 take elliptical shapes and directions of major and minor axes are varied depending on the angle θ1. If the sectional shape is not the circle, the first region 71, the second region 72 and the third region 73 take various shapes depending on the sectional shape and the angles θ1 and θ2.

As described above, the discharging portion 20 is positioned at the first position 61 (the third position 63) and the second position 62, and is moved from the first position 61 (the third position 63) to the second position 62, furthermore, is moved from the second position 62 to the third position 63 (the first position 61) by turning the piping arm 180 through the moving portion 155 controlled by the controller 161. For example, if the width of the processing region S3 is 2 mm, a moving distance from the first position 61 (the third position 63) to the second position 62 is remarkably reduced with respect to the length of the piping arm 180 for moving the discharging portion 20. Consequently, in the case in which the moving portion 155 turns the piping arm 180 to move the discharging portion 20 from the first position 61 (the third position 63) to the second position 62 as shown in FIG. 1, the discharging portion 20 is moved almost linearly so that the angles θ1 and θ2 are maintained to be constant.

The size of the substrate W, the bore diameter ϕ of the discharging port 21, the first position 61, the second position 62, the third position 63 and a width L13 of the processing region S3 are preset and stored in a memory of the controller 161 or the like. The first position 61 and the third position 63 may be identical to each other or different from each other. In other words, the first region 71 and the third region 73 may be identical to each other or different from each other.

The second position 62 is predetermined by an experiment or the like in such a manner that the processing liquid 51 discharged to the processing region S3 from the discharging portion 20 which is continuously performing the operation for discharging the processing liquid 51 in a stable shape of the liquid column at the second position 62 does not enter the non-processing region S4 but can carry out intended processing over the processing region S3 by using the processing liquid 51. In other words, the second region 72 is a region where the discharged processing liquid 51 does not adhere to the non-processing region S4 when the discharging portion 20 continuously carries out the operation for discharging the processing liquid 51 toward the second region 72 in the stable shape of the liquid column, and is predetermined by an experiment or the like. More specifically, a distance from the inner peripheral edge E2 of the processing region S3 to a center 82 of the second region 72 is set to be equal to or greater than the diameter ϕ of the discharging port 21 as shown in FIG. 13, for example. Consequently, when the discharging portion 20 discharges the processing liquid 51 at the second position 62, it is possible to more reliably prevent the processing liquid 51 from entering the rotating axis a1 side of the substrate W from the processing region S3, that is, the non-processing region S4.

When the discharge of the processing liquid 51 is stopped, the processing liquid 51 in the passage 22 of the discharging portion 20 is sucked back toward the processing liquid supplying source 131 side to reduce an amount of the processing liquid 51 discharged from the discharging portion 20 so that the splash of the processing liquid 51 can be restrained. Even if the discharge of the processing liquid 51 is stopped without the movement of the discharging portion 20 to the peripheral edge E1 side of the substrate W in a state in which the discharging portion 20 continuously discharges the processing liquid 51 in the second position 62, accordingly, the usability of the present invention is not damaged.

By the control of the discharging portion 20 and the moving portion 155 through the controller 161, the discharging portion 20 starts the discharge of the processing liquid 51 toward the first region 71 in a state in which it is positioned at the first position 61 as shown in FIG. 14. Next, the discharging portion 20 is moved to the second position 62 along an arrow Y1 while discharging the processing liquid 51, and continuously discharges the processing liquid 51 toward the second region 72 at the second position 62. Subsequently, the discharging portion 20 is moved to the third position 63 along an arrow Y2 while discharging the processing liquid 51. When the discharging portion 20 is moved to the third position 63, it discharges the processing liquid 51 toward the third region 73. When the movement to the third position 63 is completed, the discharging portion 20 stops the discharge of the processing liquid 51. The substrate processing apparatus 100 may further include another discharging portion capable of discharging the processing liquid to the lower surface S2, and the discharging portion 20 discharges the processing liquid to the processing region S3 and another discharging portion may discharge the processing liquid to the lower surface S2. In this case, the discharge of the processing liquid to the processing region S3 and that of the processing liquid to the lower surface S2 may be carried out at the same time or sequentially.

As described above, the processing liquid 51 is discharged from the discharging portion 20 at the first position 61 toward the first region 71 in the rotating track of the processing region S3, and is discharged from the discharging portion 20 at the second position 62 toward the second region 72 of the rotating track. At start of the discharge, the shape of the liquid column of the discharged processing liquid 51 is unstable as compared with the case in which the discharge is continuously carried out. For this reason, the processing liquid 51 discharged toward the first region 71 is also discharged to the periphery of the first region 71 in some cases. The first region 71 is placed on the peripheral edge E1 side of the substrate W from the second region 72. During the movement to the second position 62 and the discharging operation in the second position 62, the discharging portion 20 continuously carries out the discharging operation. As compared with the start of the discharge, therefore, the processing liquid 51 is discharged in the stable shape of the liquid column. Accordingly, it is possible to prevent the adhesion of the processing liquid 51 to the non-processing region S4 due to the splash or the spread of the processing liquid 51 in the processing region S3 of the substrate W. Moreover, the processing liquid 51 is discharged to the substrate W by the discharging portion 20. As compared with the case in which the processing liquid leaking out of the sponge or the like is supplied to the substrate W, therefore, it is possible to supply the processing liquid in a larger amount. Thus, it is also possible to process the processing region S3 more reliably.

In both a state in which the discharging portion 20 continuously carries out the discharging operation at the second position 62 and a state in which the discharging portion 20 is moved from the second position 62 to the third position 63, furthermore, the processing liquid 51 is discharged consecutively. Therefore, the shape of the liquid column of the processing liquid 51 can be prevented from being unstable. When the discharge of the processing liquid 51 is stopped in a state in which the processing liquid 51 is discharged from the discharging portion 20 at the third positon 63 toward the third region 73, moreover, the shape of the liquid column is unstable so that the processing liquid 51 is also discharged to the periphery of the third region 73 in some cases. However, the third region 73 is placed on the peripheral edge E1 side of the substrate W from the second region 72. Accordingly, it is possible to restrain the adhesion of the processing liquid 51 to the non-processing region S4 due to the splash or the spread in the processing region S3 of the substrate W.

Figure 15:
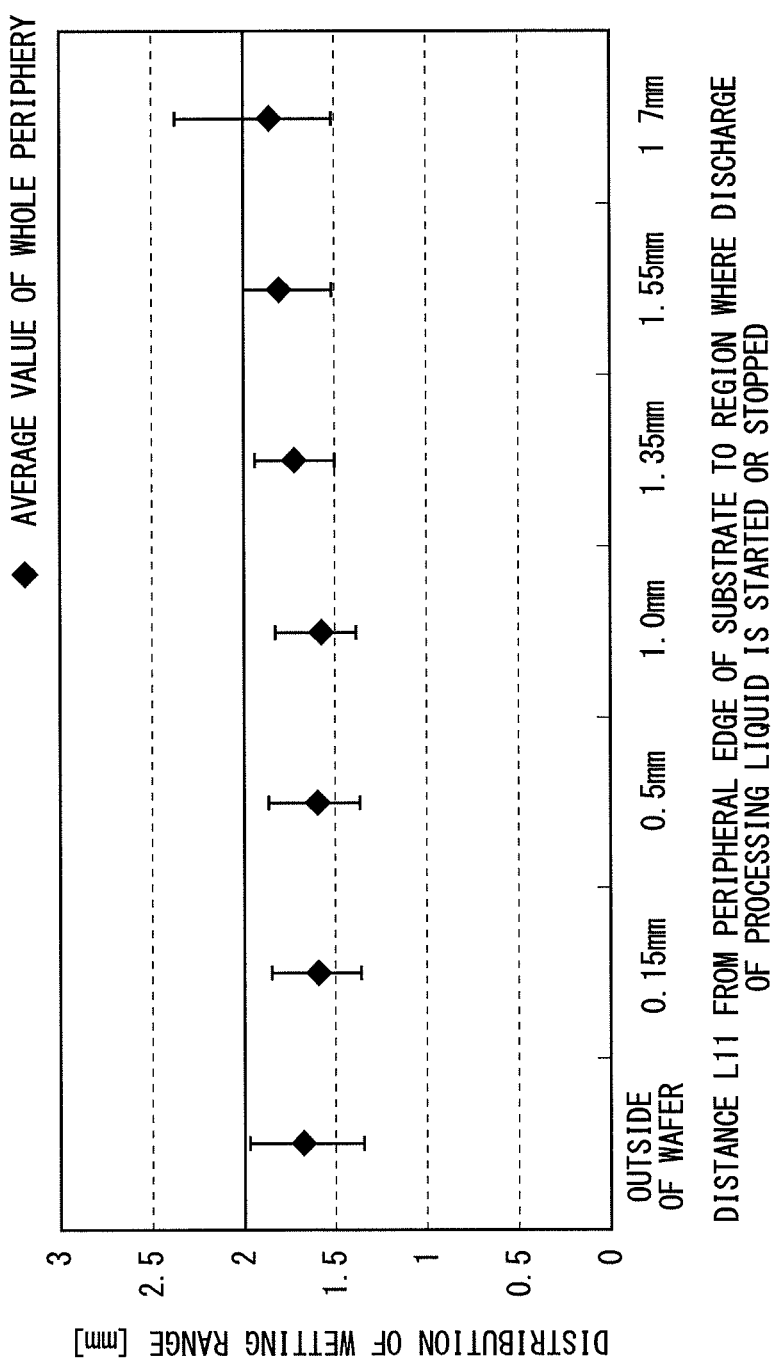
FIG. 15 is a graph showing an example of a relationship between a region on the substrate where discharging start (stop) is carried out and a wetting range distribution.

FIG. 15 is a graph showing a distribution of a wetting range of the substrate W through the processing liquid 51 over the whole periphery of the substrate W after the discharging portion 20 carries out the processing for discharging the processing liquid 51 in order illustrated in FIG. 14. The distribution of the wetting range is measured by variously changing the position of the first region 71 (that is, a distance L11 from the peripheral edge E1 of the substrate W to the center 81 of the first region 71). In the example of FIG. 15, the first region 71 in the start of the discharge and the third region 73 in the end of the discharge are identical to each other. In other words, the first position 61 and the third position 63 of the discharging portion 20 are identical to each other, and the distance L11 is identical to a distance from the peripheral edge E1 of the substrate W to a center 83 of the third region 73.

A lower end of each longitudinal bar shown for the distance L11 in an axis of abscissa indicates a minimum value of the wetting range measured over the whole periphery of the substrate W, and an upper end thereof indicates a maximum value of the wetting range. Moreover, a rhombic mark indicates an average value of the wetting range over the whole periphery of the substrate W. The width L13 (see FIG. 13) of the processing region S3 is set to be 2 mm and the position of the center 82 of the second region 72 is placed from the peripheral edge E1 of the substrate W by 1.7 mm. "Outside of wafer" described on a left end in the axis of abscissa in FIG. 15 corresponds to a state in which the first region 71 (the third region 73) includes the peripheral edge E1. "1.7 mm" described on a right end of the axis of abscissa corresponds to a state in which the first region 71 (the third region 73) is coincident with the second region 72, that is, a state in which the discharge of the processing liquid 51 is started at the second position 62 and is exactly carried out continuously at the second position 62, and is then ended at the second position 62.

Figure 16:
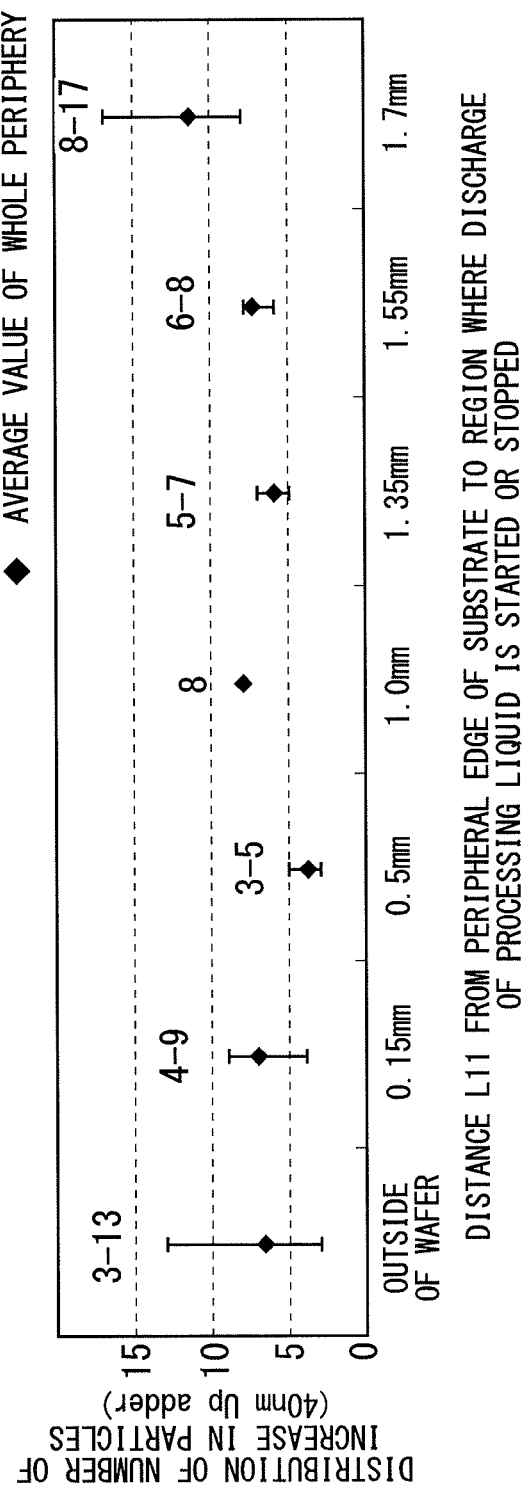
FIG. 16 is a graph showing an example of a relationship between the region on the substrate where the discharging start (stop) is carried out and a distribution of the number of increase in particles.

FIG. 16 is a graph showing an example of a distribution of the number of increase in particles adhering to the non-processing region S4 over the whole periphery of the substrate W with respect to each position (each distance L11 from the peripheral edge E1 of the substrate W to the center of each region) of the first region 71 (the third region 73) indicated by the axis of abscissa in FIG. 15. The particle having a diameter of 40 nm or more is counted. Moreover, the rhombic mark indicates an average value of the number of increase in particles over the whole periphery of the substrate W.

As shown in FIG. 15, when the distance L11 indicated by the axis of abscissa is "1.7 mm" (when the discharge of the processing liquid 51 is started and stopped at the second position 62), the wetting range exceeds the width L13 of the processing region S3 so that the wetting region enters the non-processing region S4 in a part of the whole periphery of the substrate W so that the state of the wetting region with respect to each distance L11 is the worst in both an entering amount and the uniformity of the wetting range. As shown in FIG. 16, the particle is also increased most greatly in the result of measurement with respect to the distance L11 when the distance L11 indicated by the axis of abscissa is "1.7 mm" (when the discharge of the processing liquid 51 is started and stopped at the second position 62).

As shown in FIG. 15, when the distance L11 indicated by the axis of abscissa is "0 mm" (when a part of the first region 71 and the third region 73 is placed on the outside of the wafer), the wetting region reaches a last part of the inner peripheral edge E2 of the processing region S3 in a part of the whole periphery of the substrate W. As compared with the case in which the distance L11 is 0.15 mm to 1.55 mm, the distribution width of the wetting range is increased. In other words, the uniformity of the wetting range is made poorer. Moreover, the number of the particles is increased subsequently to the case in which the distance L11 is 1.7 mm (see FIG. 16).

As shown in FIG. 15, in the case in which the distance L11 is 0.15 mm to 1.55 mm, the uniformity of the wetting range is enhanced, and furthermore, the wetting range is included in the processing region S3 over the whole periphery of the substrate W. As shown in FIG. 16, in the case in which the distance L11 is 0.15 mm to 1.55 mm, the number of increase in the particles is also included in a comparatively small value.

The case in which the distance L11 is 0.15 mm in FIGS. 15 and 16 is equivalent to the case in which the distance L11 is 0.5ϕ, that is, the first region 71 (the third region 73) is surrounded by a broken line of FIG. 13. From the results of the measurement in FIGS. 15 and 16, it is supposed that the processing liquid 51 taking the unstable shape of the liquid column which is started to be discharged toward the first region 71 can be prevented from being discharged to the peripheral edge E1 of the substrate W if the distance L11 is equal to or greater than a half of the diameter ϕ of the discharging port 21. Accordingly, it is possible to prevent the adhesion of the processing liquid 51 to the non-processing region S4 from being caused by the splash in the peripheral edge E1.

If the distance L11 from the center 83 of the third region 73 to the peripheral edge E1 of the substrate W is equal to or greater than the half of the diameter ϕ of the discharging port 21, the following is supposed. More specifically, the discharge of the processing liquid 51 to the peripheral edge E1 is prevented even if the shape of the liquid column is unstable in the process for stopping the discharge of the processing liquid 51 which is being continuously discharged toward the third region 73. Accordingly, it is possible to prevent the adhesion to the non-processing region S4 from being caused by the splash in the peripheral edge E1 of the processing liquid 51.

In the axis of abscissa of FIGS. 15 and 16, the case in which the distance L11 is 1.55 mm is equivalent to the case in which the distance L12 from the center 81 of the first region 71 to the center 82 of the second region 72 is a half of the diameter ϕ of the discharging port 21, that is, the case in which the first region 71 is surrounded in a dashed line of FIG. 13. The shape of the liquid column of the processing liquid 51 at the start of the discharge is unstable. For this reason, there is a possibility that the discharged processing liquid 51 might enter the non-processing region S4 in the case in which the distance L12, that is, a moving amount in the movement of the discharging portion 20 from the discharge starting position (the first position 61) of the processing liquid 51 to the discharge continuing position (the second position 62) thereof is small. For this reason, some length is required for the distance L12. More specifically, from the results of the measurement in FIGS. 15 and 16, it is considered that the processing liquid 51 taking the unstable shape of the liquid column which is started to be discharged toward the first region 71 is prevented from entering the non-processing region S4 if the distance L12 is equal to or greater than the half of the diameter ϕ of the discharging port 21, for example. In other words, if the distance L12 is set to be equal to or greater than the half of the diameter ϕ of the discharging port 21, for example, it is possible to restrain the adhesion to the non-processing region S4 of the processing liquid 51 started to be discharged toward the first region 71 equivalently or more as compared with the state in which the processing liquid 51 is being continuously discharged in the stable shape of the liquid column toward the second region 72. The adhesion is due to the splash or the spread of the processing liquid 51 in the processing region S3 of the substrate W. Here, the second region 72 is set to restrain the adhesion of the processing liquid 51 to the non-processing region S4 even if the processing liquid 51 is continuously discharged in the stable shape of the liquid column toward the second region 72.

6. Operation of Substrate Processing Apparatus

Figure 17:
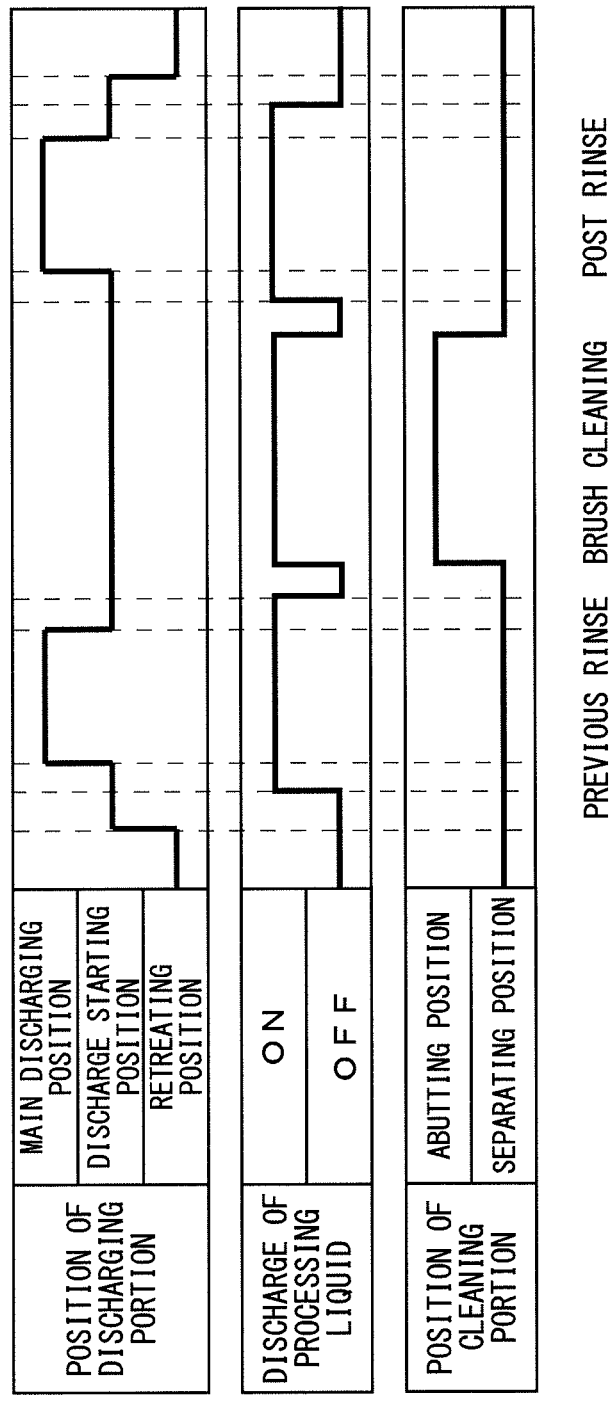
FIGS. 17 and 18 are time charts each showing an example of an operation for cleaning the substrate processing apparatus.
Figure 18:
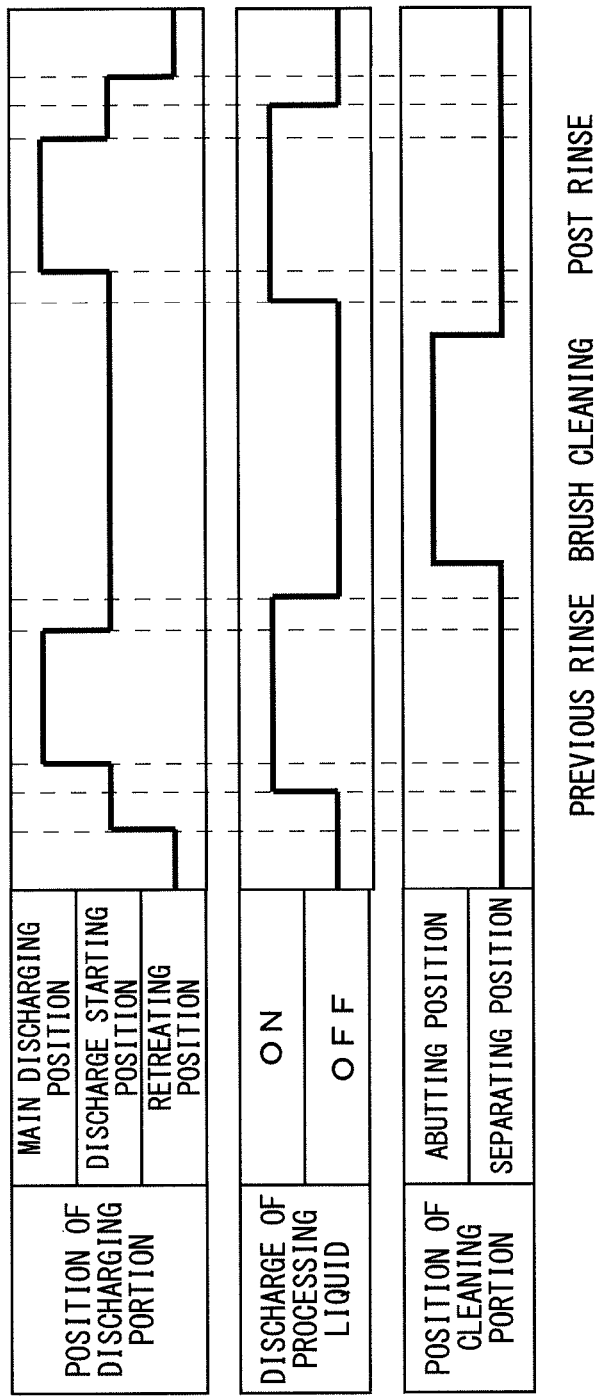
Figure 19:
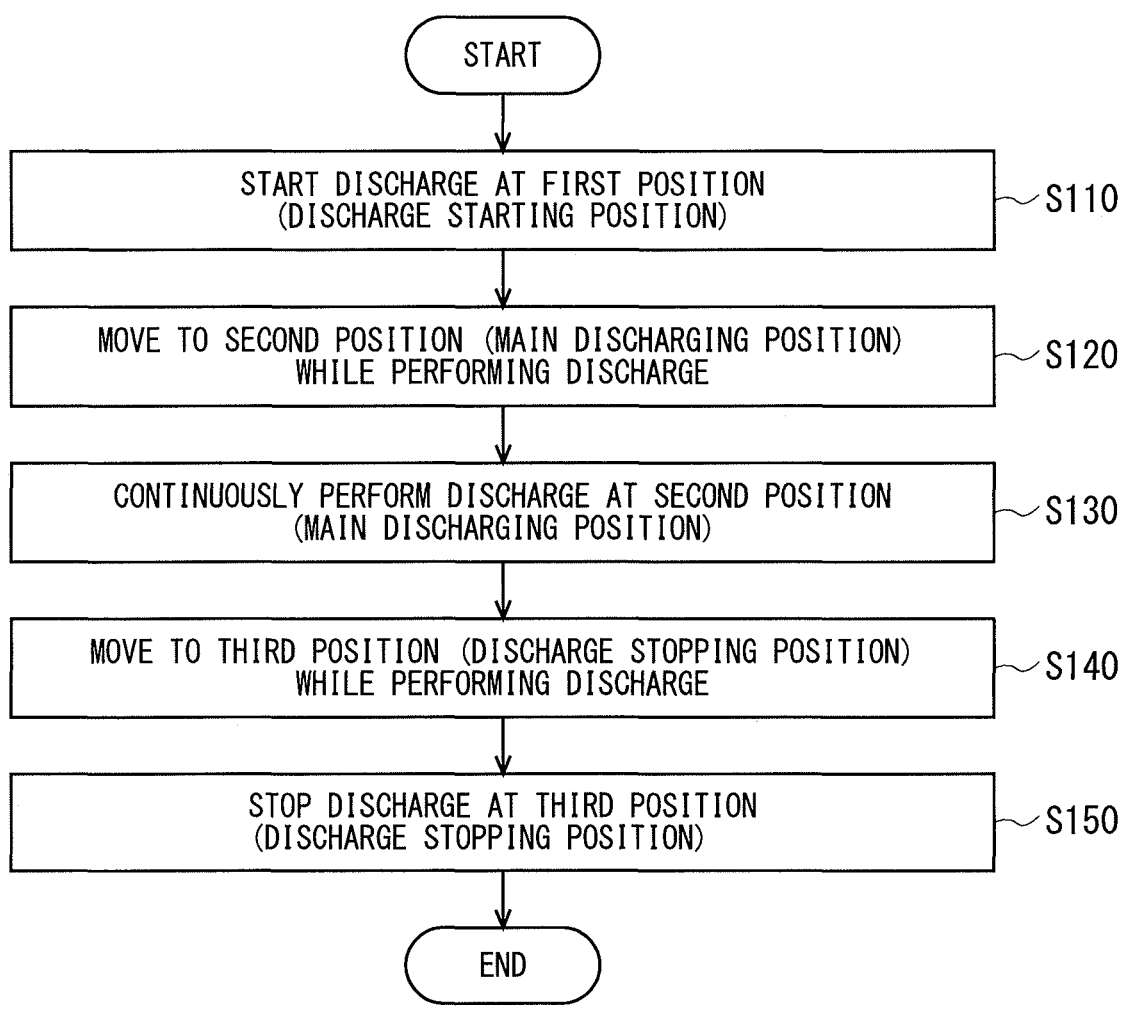
FIG. 19 is a flowchart showing an example of a processing liquid discharging operation of the substrate processing apparatus.

FIGS. 17 and 18 are time charts showing an example of the cleaning operation of the substrate processing apparatus 100. FIG. 17 is a time chart in the case in which the processing liquid is discharged during brush cleaning (during cleaning by the cleaning portion 10) and FIG. 18 is a time chart in the case in which the processing liquid is not discharged during the brush cleaning. The discharge of the processing liquid during the brush cleaning is mainly intended for wetting the brush with the processing liquid. As shown in FIG. 18, the processing liquid does not need to be discharged during the brush cleaning. FIG. 19 is a flowchart showing an example of the processing liquid discharging operation of the substrate processing apparatus 100. FIG. 20 is a flowchart showing an example of the cleaning operation of the substrate processing apparatus 100.

The substrate processing apparatus 100 carries out previous rinse processing for discharging the processing liquid (cleaning solution) 51 from the discharging portion 20 to the processing region S3 of the substrate W prior to the cleaning through the cleaning portion 10 (brush) (step S10 in FIG. 20).

Prior to the start of step S10, the position of the cleaning portion 10 is positioned at a separating position where the delivery of the substrate W to the spin chuck 5 is not disturbed. Moreover, the discharging portion 20 is also positioned at a retreating position where the delivery of the substrate W to the spin chuck 5 is not disturbed, and does not discharge the processing liquid (see FIGS. 17 and 18).

When the previous rinse processing in step S10 is started in this state, the discharging portion 20 is first positioned at the first position 61 (the discharge starting position) by the moving portion 155. The discharging portion 20 starts the discharge of the processing liquid 51 at the first position 61 (FIGS. 17, 18 and step S110 in FIG. 19), and is moved to the second position 62 (the main discharging position) by the moving portion 155 while carrying out the discharge (FIGS. 17, 18 and step S120 in FIG. 19). Next, the discharging portion 20 continuously discharges the processing liquid 51 at the second position (step S130 of FIG. 19) and the previous rinse processing is carried out. Then, the discharging portion 20 is moved to the third position 63 (the discharge stopping position) by the moving portion 155 while discharging the processing liquid 51, thereby ending the previous rinse processing (FIGS. 17, 18 and step S140 in FIG. 19). The first position 61 and the third position 63 are equal to each other. The first position 61 and the third position 63 may be different from each other. The discharging portion 20 is disposed at the third position 63 (FIGS. 17 and 18) and the discharge of the processing liquid 51 is stopped at the third position 63 (FIGS. 17, 18 and step S150 in FIG. 19).

When the previous rinse processing is ended, the brush cleaning processing is carried out by the cleaning portion 10 (brush) (step S20 in FIG. 20). In step S20, the cleaning portion 10 is moved to the abutting position on the processing region S3 of the substrate W from the separating position. In the case in which the processing liquid 51 is discharged in the brush cleaning, the discharging portion 20 discharges the processing liquid 51 at the first position 61 (the third position 63) (FIG. 17). In the brush cleaning, the discharging portion 20 may start the discharge of the processing liquid 51 at the first position 61 and may be then moved to the second position 62 while discharging the processing liquid 51, and may continuously discharge the processing liquid 51 at the second position 62. In the case in which the brush cleaning processing which is not followed by the discharge of the processing liquid 51 is performed, the discharging portion 20 does not discharge the processing liquid 51 (FIG. 18). When the brush cleaning processing is ended, the cleaning portion 10 is moved from the abutting position to the separating position, and the discharging portion 20 stops the discharge when it is discharging the processing liquid 51 (FIG. 17). Consequently, the brush cleaning processing is ended. In the case in which the discharging portion 20 is moved to the second position 62 while discharging the processing liquid 51 in the brush cleaning, thereby discharging the processing liquid 51 continuously, the discharging portion 20 is moved from the second position 62 to the third position 63 while discharging the processing liquid 51 in the end of the brush cleaning processing, and then ends the discharge of the processing liquid 51.

When the brush cleaning processing is ended, the substrate processing apparatus 100 carries out post rinse processing to be rinse processing after the brush cleaning (step S30 in FIG. 20). In the post rinse processing, the processing of steps S110 to S150 in FIG. 19 is carried out in the same manner as the previous rinse processing. Consequently, the post rinse processing is ended.

When the post rinse processing is ended, the discharging portion 20 is retreated to the retreating position by the moving portion 155 (FIGS. 17 and 18). Consequently, the cleaning operation of the substrate processing apparatus 100 is ended. In each processing, the operations of the cleaning portion 10, the discharging portion 20 and the moving portion 155 are controlled by the controller 161.

According to the substrate processing apparatus in accordance with the present preferred embodiment, the discharging portion 20 starts to discharge the processing liquid 51 at the first position 61 and is moved to the second position 61 which is closer to the rotating axis a1 than the first position 61 while carrying out the discharge, and continuously performs the discharge at the second position 62. The processing liquid 51 is discharged from the discharging port 21 in the direction of the axis 23 of the passage 22 in the discharging port 21 portion of the discharging portion 20. For this reason, the processing liquid 51 is discharged from the discharging portion 20 at the first position 61 toward the first region 71 in the rotating track of the processing region S3 and is discharged from the discharging portion 20 at the second position 62 toward the second region 72 of the rotating track. At the start of the discharge, the shape of the liquid column of the discharged processing liquid 51 is more unstable than that in the case in which the discharge is continuously carried out. Therefore, the processing liquid 51 discharged toward the first region 71 is also discharged to the periphery of the first region 71 in some cases. The first region 71 is placed on the peripheral edge E1 side of the substrate W from the second region 72. Moreover, the discharging portion 20 continuously performs the discharging operation during the movement to the second position 62 and the discharging operation at the second position 62. As compared with the start of the discharge, therefore, the processing liquid 51 is discharged in the more stable shape of the liquid column. Accordingly, it is possible to restrain the adhesion of the processing liquid 51 to the non-processing region S4 due to the splash of the processing liquid 51 in the processing region S3 of the substrate W or the spread of the processing liquid 51 in the processing region S3. Moreover, the processing liquid 51 is discharged to the substrate W by the discharging portion 20. For this reason, it is possible to supply the processing liquid in a larger amount as compared with the case in which the processing liquid leaking out of the sponge or the like is supplied to the substrate W. According to the present invention, therefore, it is also possible to process the processing region S3 more reliably.

According to the substrate processing apparatus in accordance with the present preferred embodiment described above, the distance L11 from the peripheral edge E1 of the substrate W to the center 81 of the first region 71 is equal to or greater than the half of the diameter φ of the discharging port 21. Therefore, the processing liquid 51 taking the unstable shape of the liquid column which is started to be discharged toward the first region 71 is also prevented from being discharged to the peripheral edge E1 of the substrate W. Accordingly, it is possible to restrain the adhesion of the processing liquid 51 to the non-processing region S4 due to the splash at the peripheral edge E1.

According to the substrate processing apparatus in accordance with the present preferred embodiment described above, furthermore, the distance L12 from the center 81 of the first region 71 to the center 82 of the second region 72 is equal to or greater than the half of the diameter φ of the discharging port 21. Accordingly, the processing liquid 51 taking the unstable shape of the liquid column which is started to be discharged toward the first region 71 is prevented from being discharged to the rotating axis a1 side of the substrate W from the second region 72. Therefore, it is possible to restrain the adhesion to the non-processing region S4 of the processing liquid 51 equivalently or more as compared with the case in which the processing liquid 51 is continuously discharged toward the second region 72. The adhesion is due to the splash or the spread in the processing region S3 of the substrate W caused by the processing liquid 51 started to be discharged toward the first region 71.

According to the substrate processing apparatus in accordance with the present preferred embodiment, furthermore, the discharging portion 20 discharging the processing liquid 51 at the second position 62 is moved to the third position 63 on the peripheral edge E1 side of the substrate W from the second position 62 while discharging the processing liquid 51. When the discharging portion 20 is moved to the third position 63, the processing liquid 51 is discharged toward the third region 73 in the rotating track of the processing region S3 in the direction of the axis 23 of the passage 22. Then, the discharging portion 20 stops the discharge of the processing liquid 51 at the third position 63. In both a state in which the discharging portion 20 continuously carries out the discharging operation at the second position 62 and a state in which the discharging portion 20 is moved from the second position 62 to the third position 63, the processing liquid 51 is discharged consecutively. Therefore, the shape of the liquid column of the processing liquid 51 can be prevented from being unstable. When the discharge of the processing liquid 51 is stopped in a state in which the processing liquid 51 is discharged toward the third region 73, the shape of the liquid column is unstable so that the processing liquid 51 is also discharged to the periphery of the third region 73 in some cases. However, the third region 73 is placed on the peripheral edge E1 side of the substrate W from the second region 72. Accordingly, it is possible to restrain the adhesion of the processing liquid 51 to the non-processing region S4 due to the splash or the spread of the processing liquid 51 in the processing region S3 of the substrate W.

According to the substrate processing apparatus in accordance with the present preferred embodiment, the distance from the peripheral edge E1 of the substrate W to the center of the third region 73 is equal to or greater than the half of the diameter φ of the discharging port 21. Consequently, even if the discharge of the processing liquid 51 which is being consecutively discharged toward the third region 73 is stopped so that the shape of the liquid column is unstable, it is possible to prevent the processing liquid 51 from being discharged to the peripheral edge E1. Accordingly, it is possible to restrain the adhesion to the non-processing region S4 due to splash at the peripheral edge E1 of the processing liquid 51 which is being consecutively discharged toward the third region 73 and the processing liquid 51 of which discharge is stopped.

In addition, the substrate processing apparatus in accordance with the present preferred embodiment further includes the cleaning portion 10 for cleaning the processing region S3 in abutment on the processing region S3 of the substrate W which is being rotated by the spin chuck 5. Accordingly, it is possible to scrape off the pollutant of the processing region S3, thereby cleaning the processing region S3 through the cleaning portion 10.

According to the substrate processing apparatus in accordance with the present preferred embodiment, the discharging portion 20 discharges the processing liquid 51 toward the second region (the main discharging region) 72 which is predefined in the semicircular region M1 at the downstream side in the rotating direction of the substrate W with respect to the cleaning portion 10 in the rotating track of the processing region S3. Accordingly, as compared with the case in which the processing liquid 51 is discharged to the upstream side in the rotating direction of the substrate W with respect to the cleaning portion 10, for example, the processing liquid 51 is removed by the cleaning portion 10 in the processing region S3 so that a range brought into a dry state is reduced. Therefore, the processing region S3 of the upper surface S1 can be cleaned more reliably.

According to the substrate processing apparatus in accordance with the present preferred embodiment, the discharging direction V1 of the processing liquid 51 is the oblique direction having the component V2 and the component V3. The component V2 is turned toward the downstream side in the rotating direction of the substrate W along the tangential line 91 in the proximity part to the second region 72 in the peripheral edge E1 of the substrate W. The component V3 is turned from the central side (the rotating axis a1 side) of the substrate W in the orthogonal direction to the tangential line 91 toward the peripheral edge E1 side. Accordingly, the processing liquid 51 discharged to the processing region S3 can be prevented from adhering to the non-processing region S4 due to the splash or the spread up to the non-processing region S4.

According to the substrate processing apparatus in accordance with the present preferred embodiment, the gas injecting portion 30 generates, on the substrate W, the gas flow turned from the injecting target region 201 to the cleaning portion 10 side. Accordingly, the pollutant scraped off by the cleaning portion 10 or the mist of the processing liquid 51 generated by the rotation of the cleaning portion 10 or the like can be prevented from scattering to the non-processing region S4 and adhering to the non-processing region S4.

According to the substrate processing apparatus in accordance with the present preferred embodiment, the injecting port 31a of the gas injecting portion 30 is slit-shaped and takes the long shape in the circumferential direction of the substrate W which is curved along the proximity part to the cleaning portion 10 including the abutting part on the cleaning portion 10 in the peripheral edge E1 of the substrate W as seen through in the direction of the rotating axis a1 of the substrate W from above. Consequently, as compared with the case in which the perspective image of the injecting port 31a is long in the direction of the tangential line 92 of the abutting part on the cleaning portion 10 in the peripheral edge E1, the respective distances L3 between the respective parts of the slit-shaped injecting port 31a and the proximity part can be made substantially equal to each other. Accordingly, the gas 52 can be supplied uniformly to the proximity part. Therefore, it is possible to prevent mist or the like from scattering from the proximity part and adhering to the non-processing region S4 of the upper surface S1 of the substrate W.

According to the substrate processing apparatus in accordance with the present preferred embodiment, the injecting ports 31b of the gas injecting portion 30 are arranged apart from each other over the virtual line K1 curved along the proximity part to the cleaning portion 10 including the abutting portion on the cleaning portion 10 in the peripheral edge E1 of the substrate W as seen through in the direction of the rotating axis a1 of the substrate W from above the gas injecting portion 30. Consequently, the respective distances L3 between the injecting ports 31b and the proximity part can be made substantially equal to each other as compared with the case in which the respective perspective images of the injecting ports 31b are arranged in the direction of the tangential line 92 in the abutting part on the cleaning portion 10 in the peripheral edge E1 of the substrate W. Accordingly, the gas 52 can be supplied uniformly to the proximity part. Therefore, it is possible to prevent mist or the like from scattering from the proximity part and adhering to the non-processing region S4 of the upper surface S1.

According to the substrate processing apparatus in accordance with the present preferred embodiment, the injecting port 31c of the gas injecting portion 30 is slit-shaped and takes the long shape in the circumferential direction of the cleaning portion 10 which is curved along the opposed part to the peripheral edge E1 of the substrate W in the outer peripheral surface of the cleaning portion 10 as seen through in the direction of the rotating axis a1 from above the gas injecting portion 30. Consequently, the respective distances L5 between the respective parts of the slit-shaped injecting port 31c and the opposed part in the outer peripheral surface of the cleaning portion 10 can be made substantially equal to each other as compared with the case in which the perspective images of the injecting port 31c are long in the direction of the tangential line 92 in the abutting part on the cleaning portion 10 in the peripheral edge E1 of the substrate W. Accordingly, the gas 52 can be supplied uniformly to the contact position of the cleaning portion 10 with the substrate W from the periphery of the cleaning portion 10. Therefore, it is possible to prevent mist or the like from scattering from the cleaning portion 10 and adhering to the non-processing region S4 of the upper surface S1.

According to the substrate processing apparatus in accordance with the present preferred embodiment, the injecting ports 31d of the gas injecting portion 30 are arranged apart from each other over the virtual line K2 curved along the opposed part to the peripheral edge E1 of the substrate W in the outer peripheral surface of the cleaning portion 10 as seen through in the direction of the rotating axis a1 from above the gas injecting portion 30. Consequently, the respective distances L5 between the injecting ports 31d and the opposed portion can be made substantially equal to each other as compared with the case in which the respective perspective images of the injecting ports 31d are arranged in the direction of the tangential line 92 in the abutting part on the cleaning portion 10 in the peripheral edge E1. Accordingly, the gas 52 can be supplied uniformly to the contact position of the cleaning portion 10 with the substrate W from the periphery of the cleaning portion 10. Therefore, the mist or the like generated from the cleaning portion 10 can be prevented from scattering to the non-processing region S4 of the upper surface S1.

According to the substrate processing method in accordance with the present preferred embodiment, furthermore, the discharging portion 20 at the first position 61 is caused to start the discharge of the processing liquid 51 toward the first region 71 in the rotating track of the processing region S3 of the substrate W which is being rotated, and consecutively, is caused to continuously discharge the processing liquid 51, and at the same time, is moved to the second position 62 where the processing liquid 51 can be discharged toward the second region 72 in the rotating track. In addition, the discharging portion 20 is subsequently caused to continuously discharge the processing liquid 51 toward the second region 72 at the second position 62. At the start of the discharge, the shape of the liquid column of the discharged processing liquid 51 is more unstable as compared with the case in which the discharge is continuously carried out. For this reason, the processing liquid 51 discharged toward the first region 71 is also discharged to the periphery of the first region 71 in some cases. The first region 71 is placed on the peripheral edge E1 side of the substrate W from the second region 72. During the movement to the second position 62 and the discharging operation at the second position 62, the discharging portion 20 continuously carries out the discharging operation. Therefore, the processing liquid 51 can be discharged in the more stable shape of the liquid column as compared with that at the start of the discharge. Accordingly, it is possible to prevent the adhesion of the processing liquid to the non-processing region S4 due to the splash of the processing liquid 51 in the processing region S3 of the substrate W or the spread of the processing liquid 51 in the processing region S3.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method of processing a peripheral edge part of a substrate, comprising:
    a substrate rotating step of holding and rotating a substrate;
    a cleaning step of cleaning said upper surface peripheral edge part by a brush simultaneously with the substrate rotating step; and
    a discharging step of discharging a processing liquid to said upper surface peripheral edge part in an upper surface of said substrate by a discharging portion including a discharging port capable of discharging the processing liquid simultaneously with the substrate rotating step;
    said discharging step including:
        a first step of causing said discharging portion to start discharge of said processing liquid toward a first region in a rotating track in said upper surface peripheral edge part at a first position where said discharging portion can discharge said processing liquid toward said first region;
        a second step of moving said discharging portion discharging said processing liquid toward said first region at said first position to a second position where said processing liquid can be discharged toward a second region in said rotating track while causing said discharging portion to continuously discharge said processing liquid; and
        a third step of causing said discharging portion to continuously discharge said processing liquid toward said second region at said second position,
    said first region being closer to the peripheral edge of said substrate than said second region,
    said discharging step further including:
        a fourth step of discharging said processing liquid toward said first region in said rotating track in said upper surface peripheral edge part of said upper surface of said substrate by said discharging portion including said discharging port capable of discharging the processing liquid during said cleaning step;
        a fifth step of moving said discharging portion after said cleaning step is ended and discharging said processing liquid from said discharging port toward said second region in said upper surface peripheral edge part, said second region being closer to the rotating axis of the substrate than said first region;
        a sixth step of moving said discharging portion while carrying out the discharge by said discharging portion after said fifth step and continuously discharging said processing liquid by said discharging portion toward said first region; and
        a seventh step of stopping the discharge of said processing liquid by said discharging portion subsequently to said sixth step.

2. The substrate processing method according to claim 1, wherein a distance from a peripheral edge of said substrate to a center of said first region is equal to or greater than a half of a diameter of said discharging port.

3. The substrate processing method according to claim 1, wherein a distance from a center of said first region to a center of said second region is equal to or greater than a half of a diameter of said discharging port.

4. The substrate processing method according to claim 1, wherein said discharging step comprises:
    a eighth step of moving said discharging portion to a third position while causing said discharging portion discharging said processing liquid toward said second region at said second position to continuously discharge said processing liquid subsequently to said third step; and
    a ninth step of causing said discharging portion to stop said discharge of said processing liquid at said third position,
    said third position being a position where said discharging portion can discharge said processing liquid toward a third region in said rotating track, and
    said third region being closer to the peripheral edge of said substrate than said second region.

5. The substrate processing method according to claim 4, wherein a distance from a peripheral edge of said substrate to a center of said third region is equal to or greater than a half of a diameter of said discharging port.

6. The substrate processing method according to claim 1, wherein said brush being capable of abutting on said upper surface peripheral edge part of said substrate to which said discharging portion discharges said processing liquid, thereby cleaning said upper surface peripheral edge part.

* * * * *